United States Patent
Nomura et al.

(10) Patent No.: US 7,161,447 B2
(45) Date of Patent: Jan. 9, 2007

(54) PIEZOELECTRIC RESONATOR, PIEZOELECTRIC FILTER, AND COMMUNICATION APPARATUS

(75) Inventors: Tadashi Nomura, Kyoto (JP); Hajime Yamada, Otsu (JP); Ryuichi Kubo, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 42 days.

(21) Appl. No.: 10/656,246

(22) Filed: Sep. 8, 2003

(65) Prior Publication Data
US 2004/0056735 A1 Mar. 25, 2004

(30) Foreign Application Priority Data
Sep. 25, 2002 (JP) ............................. 2002-279428

(51) Int. Cl.
*H03H 9/09* (2006.01)
*H03H 9/54* (2006.01)

(52) U.S. Cl. ..................... 333/187; 333/189; 310/326
(58) Field of Classification Search ................ 333/187, 333/189, 190, 191; 310/324, 326
See application file for complete search history.

(56) References Cited

U.S. PATENT DOCUMENTS

| | | | |
|---|---|---|---|
| 5,231,327 A | | 7/1993 | Ketcham |
| 5,910,756 A | * | 6/1999 | Ella ............................ 333/133 |
| 6,131,256 A | | 10/2000 | Dydyk et al. |
| 6,150,703 A | | 11/2000 | Cushman et al. |
| 6,215,375 B1 | * | 4/2001 | Larson et al. ................ 333/187 |
| 6,424,237 B1 | * | 7/2002 | Ruby et al. .................. 333/187 |
| 6,462,631 B1 | * | 10/2002 | Bradley et al. .............. 333/189 |
| 6,788,170 B1 | * | 9/2004 | Kaitila et al. ................ 333/187 |
| 6,828,713 B1 | * | 12/2004 | Bradley et al. .............. 310/324 |

FOREIGN PATENT DOCUMENTS

| | | |
|---|---|---|
| EP | 1 041 717 A | 10/2000 |
| EP | 1 209 807 A2 | 5/2002 |
| EP | 1 217 734 A2 | 6/2002 |
| EP | 1 233 511 A2 | 8/2002 |
| JP | 58-031609 | 2/1983 |
| JP | 60-206033 | 10/1985 |
| JP | 02-185057 | 7/1990 |
| JP | 2001-168674 | 6/2001 |
| JP | 2002-223144 | 8/2002 |
| JP | 2002-237738 | 8/2002 |
| WO | WO 02/43243 | 5/2002 |

OTHER PUBLICATIONS

Official Communication issued on Aug. 23, 2005, in the corresponding Japanese Application No. 2002-279428. (With full English translation)..
Official Communication issued on Oct. 21, 2005, in the corresponding European Application No. 03021253.4.

(Continued)

*Primary Examiner*—Dean Takaoka
(74) *Attorney, Agent, or Firm*—Keating & Bennett, LLP

(57) ABSTRACT

A piezoelectric resonator includes a supporting substrate having an opening or a concavity, a vibrating section in which at least one pair of an upper electrode and a lower electrode oppose each other so as to sandwich an upper surface and a lower surface of at least one layer of piezoelectric thin film, the vibrating portion being formed over the opening or the concavity, and a heat dissipating film disposed over at least one of the upper electrode and the piezoelectric thin film so as not to cover the vibrating section.

45 Claims, 19 Drawing Sheets

OTHER PUBLICATIONS

Ketcham et al.; "Performance of TFR Filters Under Elevated Power Conditions"; 42$^{nd}$ Annual Frequency Control Symposium; 1988; Microelectronics Research Center; Applied Sciences Center; pp. 106-111.

Seabury et al., "Thin Film ZnO Based Bulk Acoustic Mode Filters"; Microwave Symposium Digest; vol. 1; Jun. 1997; pp. 181-184.

Official Communication Issued on Feb. 14, 2006, in the corresponding European Application No. 03021253.4.

Official Commuication issued in the corresponding European Patent Application No. 03021253.4-2215, dated May 8, 2006.

* cited by examiner

PIEZOELECTRIC RESONATOR, PIEZOELECTRIC FILTER, AND COMMUNICATION APPARATUS

BACKGROUND OF THE INVENTION

1. Field of the Invention

The present invention relates to piezoelectric resonators, piezoelectric filters, and duplexers and communication apparatuses including the same. More specifically, the present invention relates to a piezoelectric resonator and piezoelectric filter that are used in filters, oscillators, and communication devices and that generate thickness longitudinal vibration to function as filters in the VHF band, the UHF band, or at ultrahigh frequencies above such bands, and to a duplexer and a communication device including the same.

2. Description of the Related Art

Recently, filters that are used for high-frequency stages (RF, particularly frequencies above the GHz band) of communication devices such as cellular phones have been developed using piezoelectric resonators having favorable characteristics. The favorable characteristics include small size and light weight, vibration endurance and shock endurance, precision and reliability of products, automatic and simplified mounting allowed by the elimination of the need for adjusting circuitry, and ease of manufacturing high-frequency components.

For example, a piezoelectric resonator includes a substrate having an opening or a concavity, a diaphragm implemented by an insulating thin film disposed over the opening or concavity of the substrate, and a vibrating section in which at least one pair of an upper electrode and a lower electrode oppose each other so as to sandwich an upper surface and a lower surface of a thin-film section having at least one layer of a piezoelectric thin film. This type of piezoelectric resonator is disclosed, for example, in Japanese Unexamined Patent Application Publication No. 2001-168674, published on Jun. 22, 2001. In the piezoelectric resonator, because the piezoelectric resonator has a piezoelectric member implemented by thin films, the high frequency operating range can be increased to several hundred MHz to several thousand MHz.

In the piezoelectric resonator described above, the dimensions of electrodes must be restricted within a predetermined range in order to suppress unwanted vibration. Furthermore, in order to trap vibration energy in the vibrating section, the dimensions of the electrodes must be small relative to the dimension of the diaphragm. Thus, when a high voltage is applied, the voltage is concentrated in the small vibrating section, generating a relatively large amount of heat in the vibrating section.

However, according to the related art, since the diaphragm constituting the vibrating section is formed by thin films and has a small heat capacity, the heat that is generated is hardly dissipated, and most of the heat is accumulated in the vibrating section, causing an increase in the temperature of the vibrating section. The temperature increase in the vibrating section could possibly cause destruction of the vibrating section, degrading the stability of operation.

SUMMARY OF THE INVENTION

In order to solve the problems described above, preferred embodiments of the present invention provide a piezoelectric resonator including a substrate having an opening or a concavity, a vibrating section in which at least one pair of an upper electrode and a lower electrode oppose each other so as to sandwich an upper surface and a lower surface of a thin-film section having at least one layer of a piezoelectric thin film, the vibrating section being disposed over the opening or the concavity, and a heat dissipating film disposed over at least one of the upper electrode and the thin-film section so as not to cover the vibrating section.

According to the unique structure of preferred embodiments of the present invention, the heat dissipating film prevents unwanted vibration of the piezoelectric resonator, and also greatly improves heat dissipation and voltage endurance so as to avoid degradation in resonance characteristics even if a high voltage is applied, whereby the stability of operation is improved.

In the piezoelectric resonator, the heat dissipating film preferably has a thermal conductivity of approximately 150 W/(m·K) or higher.

In the piezoelectric resonator, the heat dissipating film may include an insulating material selected from the group consisting of silicon, aluminum nitride, and diamond.

Alternatively, in the piezoelectric resonator, the heat dissipating film may be composed of a metal selected from the group consisting of copper, aluminum, gold, and silver, or an alloy mainly composed of copper, aluminum, gold, or silver.

Also preferably, in the piezoelectric resonator, a distance between the heat dissipating film and the vibrating section is approximately one half of a vibrating wavelength of the vibrating section.

Furthermore, in the piezoelectric resonator, the opening or the concavity may be entirely covered by the heat dissipating film except over the vibrating section.

Also, in the piezoelectric resonator, a peripheral region of the opening or the concavity is preferably covered by the heat dissipating film.

Also, in the piezoelectric resonator, the vibrating section preferably has a polygonal shape with edges of different lengths as viewed in a thickness direction, and at least the longest edge of the vibrating section extends along an edge of the opening or the concavity.

Furthermore, in the piezoelectric resonator, the longest edge of the vibrating section preferably has a length that is longer than a distance between the opening or the concavity and a point of the vibrating section that is most distant from the edge of the opening or the concavity.

Also preferably, in the piezoelectric resonator, a distance between the longest edge of the vibrating section and the edge of the opening or the concavity is approximately one half of a vibrating wavelength of the vibrating section.

Furthermore, in the piezoelectric resonator, all of the edges of the vibrating section may extend along edges of the opening or the concavity, and distances between all of the edges of the vibrating section and the associated edges of the opening or the concavity may be approximately one half of the vibrating wavelength of the vibrating section.

Preferably, in the piezoelectric resonator, a sum W of all edges of the vibrating section, extending along edges of the opening or the concavity, and a distance L between the opening or the concavity and a point of the vibrating section that is most distant from an edge of the opening or the concavity satisfies a relationship of $L/W \leq 0.8$.

Also preferably, in the piezoelectric resonator, the vibrating section as viewed in the thickness direction is as long as or longer than about twenty times a vibrating wavelength of the vibrating section in a lengthwise direction thereof, and is not wider than about five times the vibrating wavelength in a width direction thereof.

Furthermore, in the piezoelectric resonator, the vibrating section as viewed in the thickness direction may have a shape of an isosceles triangle.

According to another preferred embodiment of the present invention, a piezoelectric resonator includes a substrate having an opening or a concavity, and a vibrating section in which at least one pair of an upper electrode and a lower electrode oppose each other so as to sandwich an upper surface and a lower surface of a thin-film section having at least one layer of a piezoelectric thin film, the vibrating section being disposed over the opening or the concavity, wherein the vibrating section as viewed in a thickness direction has a polygonal shape with edges of different lengths, and at least a longest edge of the vibrating section extends along an edge of the opening or the concavity.

According to the unique arrangement of this preferred embodiment, since at least the longest edge of the vibrating section having the polygonal shape with edges of different lengths as viewed in the thickness direction extends along the edge of the opening or the concavity, heat dissipation of the vibrating section is greatly improved, so that degradation of resonance characteristics is avoided even if a high voltage is applied, whereby the stability of operation is improved.

In the piezoelectric resonator, the longest edge of the vibrating section preferably has a length longer than a distance between the opening or the concavity and a point of the vibrating section that is most distant from the edge of the opening or the concavity.

Also preferably, in the piezoelectric resonator, a distance between the longest edge of the vibrating section and the edge of the opening or the concavity is approximately one half of a vibrating wavelength of the vibrating section.

Furthermore, in the piezoelectric resonator, all of the edges of the vibrating section may extend along edges of the opening or the concavity, and distances between all of the edges of the vibrating section and the associated edges of the opening or the concavity may be approximately one half of the vibrating wavelength of the vibrating section.

Preferably, in the piezoelectric resonator, a sum W of all edges of the vibrating section, extending along edges of the opening or the concavity, and a distance L between the opening or the concavity and a point of the vibrating section that is most distant from an edge of the opening or the concavity satisfies a relationship of $L/W \leq 0.8$.

Also preferably, in the piezoelectric resonator, the vibrating section as viewed in the thickness direction is as long as or longer than about twenty times a vibrating wavelength of the vibrating section in a lengthwise direction thereof, and is not wider than about five times the vibrating wavelength in a width direction thereof.

Furthermore, in the piezoelectric resonator, the vibrating section as viewed in the thickness direction may have a shape of an isosceles triangle.

Furthermore, in the piezoelectric resonator, the piezoelectric thin film may be made of mainly zinc oxide or aluminum nitride.

Another preferred embodiment of the present invention provides a piezoelectric filter including at least one of the piezoelectric resonators described above. Preferably, in the piezoelectric filter, piezoelectric resonators are arranged in a ladder configuration.

Yet another preferred embodiment of the present invention provides a duplexer including one of the piezoelectric resonators described above. A further preferred embodiment of the present invention provides a communication device including one of the piezoelectric resonators described above.

According to the piezoelectric filter, duplexer, and communication device, piezoelectric resonators that exhibit sufficient heat dissipation and improved stability of operation are used, so that the stability of operation over time is improved and therefore durability is improved.

Other features, elements, characteristics and advantages of the present invention will become more apparent from the following detailed description of preferred embodiments with reference to the attached drawings.

DETAILED DESCRIPTION OF PREFERRED EMBODIMENTS

Preferred embodiments of the present invention will be described with reference to FIGS. 1 to 19.

First Preferred Embodiment

Figure 1:
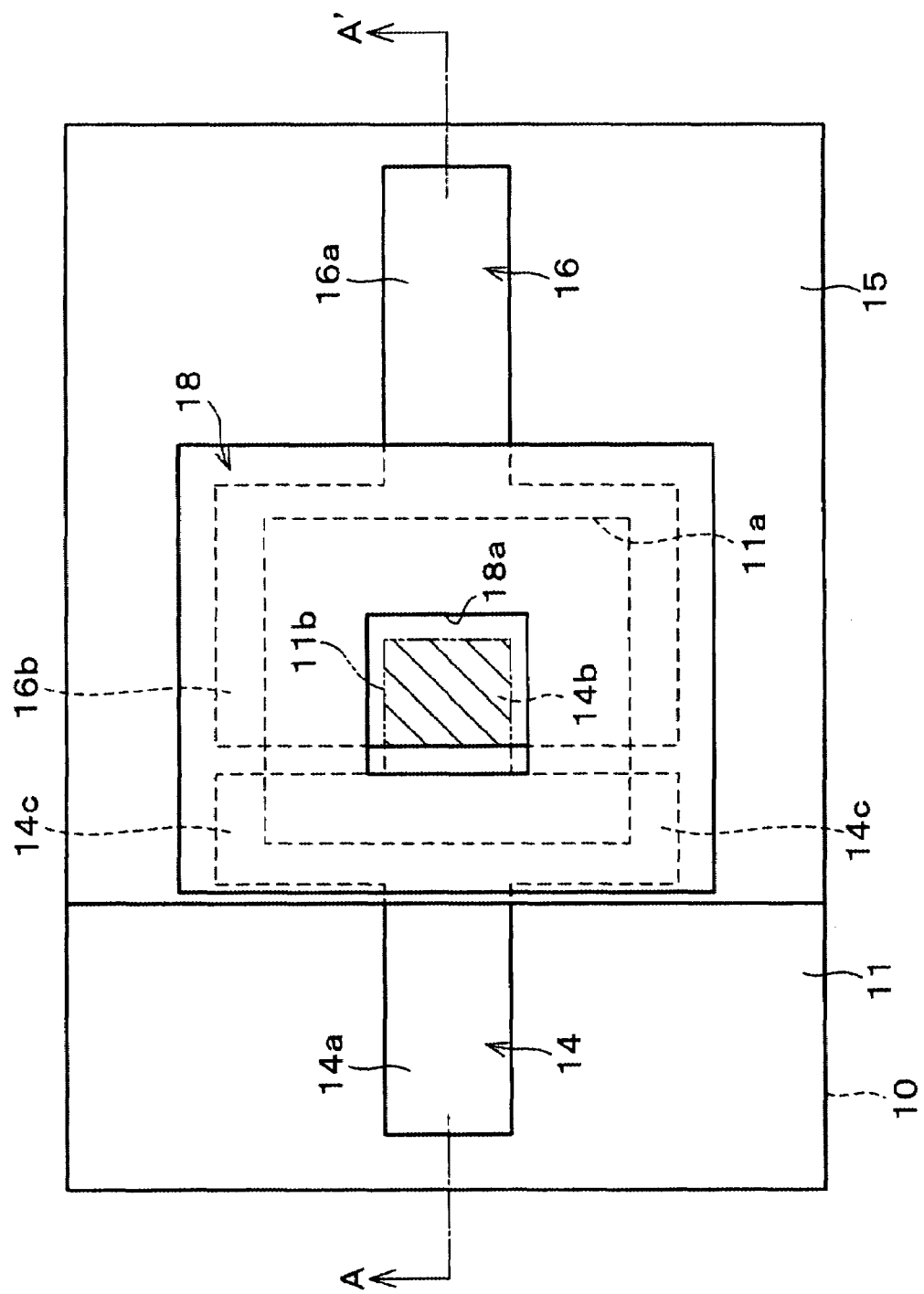
FIG. 1 is a plan view of a piezoelectric resonator according to a first preferred embodiment of the present invention.
Figure 2:
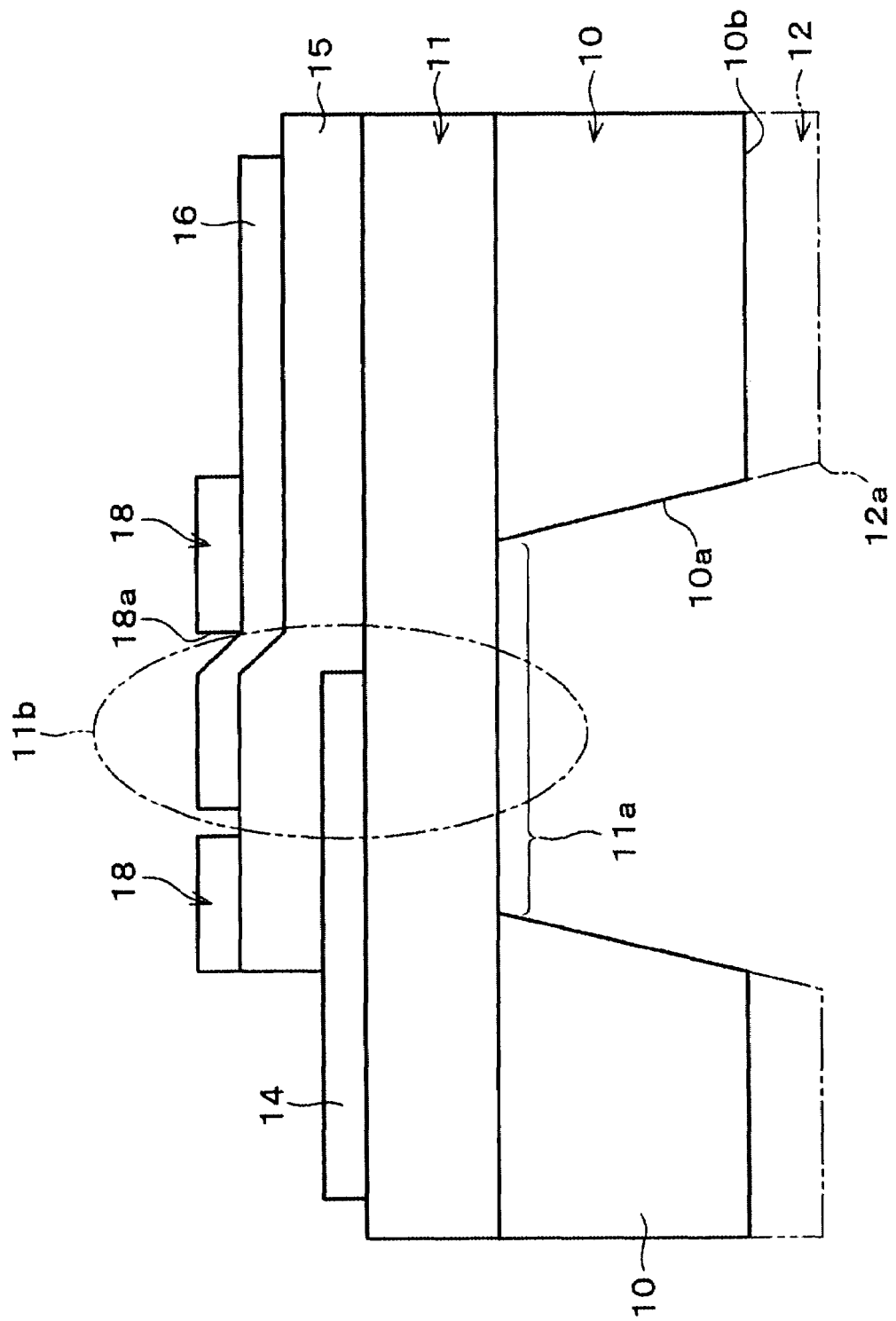
FIG. 2 is a sectional view of the piezoelectric resonator, taken along a line A–A' in FIG. 1.

First, a piezoelectric resonator according to a first preferred embodiment of the present invention will be described, beginning with a description of a method of manufacturing the same. Referring to FIGS. 1 and 2, first, silicon dioxide ($SiO_2$) films 11 and 12 are formed respectively on both surfaces of a supporting substrate 10 that is a substantially rectangular plate, preferably composed of silicon with a plane direction of (1 0 0), for example, by thermal oxidation or sputtering, or other suitable process.

Then, in the $SiO_2$ film 12 on a bottom surface of the supporting substrate 10, a substantially rectangular window 12a having substantially parallel edges in a direction of (1 1 0) is formed. Then, using the $SiO_2$ film 12 with the window 12a as a mask, the silicon constituting the supporting substrate 10 is etched at a temperature of approximately 90° C. in TMAH (tetramethyl ammonium hydroxide) solution.

Since the rate of etching by the TMAH solution is highly dependent on crystal orientation, a surface 10a in a direction of (1 1 1) that makes an angle of approximately 55° with a surface 10b in a surface direction (1 0 0) of the supporting substrate 10 appears as the etching proceeds, and an opening penetrating through the supporting substrate 10 in a thickness direction thereof is formed.

The etching stops upon reaching the $SiO_2$ film 11 on a top surface. Since the etching fully stops at the $SiO_2$ film 11, the resonator has a smooth surface, and the thickness of the resonator as a whole can be controlled more precisely. Although the $SiO_2$ film 12 remaining in the manufacturing process is finally removed in the first preferred embodiment, the $SiO_2$ film 12 may be maintained and not removed.

In that case, an alumina ($Al_2O_3$) film or an aluminum nitride (AlN) film may be additionally formed on the $SiO_2$ film 11 on the opposite surface, for example, by vacuum deposition or sputtering, thereby forming a lamination of two or more layers. Thus, a diaphragm 11a faces the opening (vacant portion) of the supporting substrate 10, defined by the surface 10a in the direction of (1 1 1).

Regarding the diaphragm 11a, the $SiO_2$ film 11 usually has positive resonance-frequency temperature characteristics and generates a compressive stress. On the other hand, the $Al_2O_3$ film usually has negative resonance-frequency temperature characteristics and generates a tensile stress. Preferably, the diaphragm 11a includes an insulator having a high thermal conductivity in order to improve heat dissipation.

Then, on the diaphragm 11a, a lower electrode 14 preferably made of aluminum (Al), a piezoelectric thin film 15 made of, for example, zinc oxide (ZnO) or aluminum nitride (AlN), and an upper electrode 16 preferably made of aluminum (Al) are sequentially formed by vacuum deposition or sputtering and etching. The piezoelectric thin film 15 has negative resonance-frequency temperature characteristics, and generates a compressive stress.

The lower electrode 14 is preferably formed in a strip shape so as to extend in a lengthwise direction with a proximal end 14a at a lengthwise end of the supporting substrate 10 and with a distal end 14b at a central portion of the diaphragm 11a.

Furthermore, on the lower electrode 14, wings 14c are arranged so as to extend on both sides in a width direction of the lower electrode 14 and to cover a portion of the opening 11a and a peripheral portion thereof on both sides of the lower electrode 14. Thus, the lower electrode 14, over the diaphragm 11 and in the vicinity of the periphery thereof, is substantially cruciform-shaped.

The upper electrode 16 is preferably formed in a strip shape so as to extend in a lengthwise direction with a proximal end 16a at a lengthwise end of the supporting substrate 10, opposite to the proximal end 14a of the lower electrode 14, and with a distal end 16b at a central portion of the diaphragm 11a.

Furthermore, the distal end 16b of the upper electrode 16 is arranged so as to extend on both sides in a width direction of the upper electrode 16 and to oppose the distal end 14b of the lower electrode 14 and cover a portion of the opening 11a and a peripheral portion thereof on both sides of the upper electrode 16. Thus, the upper electrode 16, over the diaphragm 11a and in the vicinity of the periphery thereof, is preferably substantially T-shaped.

Furthermore, the wings 14c of the lower electrode 14 and the distal end 16b of the upper electrode 16 are disposed on the opposite sides of the piezoelectric thin film 15 so as not to oppose each other. Thus, the strength of a vibrating section 11b is improved while avoiding unwanted vibration of other elements.

In the piezoelectric resonator described above, assuming a resonant frequency of 2 GHz, the total thickness of the $SiO_2$ film 11, the lower electrode 14, the piezoelectric thin film 15, and the upper electrode 16 can be chosen to be on the order of about 3 μm.

In the piezoelectric resonator, the thickness of the $SiO_2$ film 11, the area of the lower electrode 14, the thickness of the piezoelectric thin film 15, and the area of the upper electrode 16 are chosen in accordance with a vibration mode (e.g., secondary mode). Furthermore, by additionally forming an $Al_2O_3$ film on the $SiO_2$ film 11 to form a multilayer structure, the temperature coefficient (ppm/° C.) of the resonant frequency of the piezoelectric resonator can be readily set to substantially zero.

Furthermore, in the piezoelectric resonator, the lower electrode 14, the piezoelectric thin film 15, and the upper electrode 16 are preferably arranged so as to form a energy trap type resonator. Thus, the energy of vibration is prevented from being leaked into the supporting substrate 10 along the diaphragm 11a, thereby achieving resonance with a high Q factor.

As described above, since the thickness of the $SiO_2$ film 11 defining an insulating film (supporting film) can be made very thin, the piezoelectric resonator is allowed to operate at a high frequency of 100 MHz or higher with a fundamental or a low order (e.g., second order) overtone. Furthermore, the piezoelectric resonator can be arranged such that temperature characteristics and internal stresses of the films cancel each other, avoiding negative effect of temperature change and internal stresses.

Furthermore, the dimension of the diaphragm 11a of the piezoelectric resonator can be made as small as several hundred μm or smaller, allowing the piezoelectric resonator to be incorporated into a semiconductor integrated circuit. Furthermore, the piezoelectric resonator, even though it operates at several GHz, does not require patterning on a submicron order as opposed to a surface acoustic wave (SAW) device, serving to facilitate and simplify manufacturing thereof.

Furthermore, in the piezoelectric resonator according to preferred embodiments of the present invention, a heat dissipating film 18, preferably made of an insulator such as silicon, is formed in a substantially square-O shape on the piezoelectric thin film 15 and the upper electrode 16 so as to cover the opening 11a except over the vibrating section 11b. Thus, the heat dissipating film 18 has a window 18a at a substantially central portion thereof so as not to cover the vibrating section 11b.

In the arrangement described above, the heat dissipating film 18 greatly improves heat dissipation from the vibrating section 11b to the supporting substrate 10, thus significantly improving voltage endurance, whereby the stability of operation over time is improved.

The heat dissipating film 18 is not limited to the Si film described above, and may alternatively be composed of an insulator such as AlN or diamond, or a conductor such as a metallic film composed of Cu, Al, Au, or Ag, or an alloy mainly composed of Cu, Al, Au, or Ag, or other suitable material.

Preferably, the heat dissipating film 18 has a high thermal conductivity in order to improve heat dissipation, and a thermal conductivity of about 150 W/(m·K) or higher is acceptable. The thermal conductivities (W/(m·K)) of the materials listed above are as follows: Si=168; AlN=150; diamond=1,600; Cu=403; Al=236; Au=319; Ag=428. The optimal material for the heat dissipating film 18 would be diamond from the perspective of thermal conductivity alone since the thermal conductivity thereof is significantly higher than thermal conductivities of other materials; however, Cu, Al, Si, etc. are suitable considering the ease of manufacturing and cost as well.

However, if the heat dissipating film 18 is implemented by a metallic film made of Cu, Al, or other suitable material and if the heat dissipating film 18 is in electrical contact with the lower electrode 14 and the upper electrode 16, a segment of the heat dissipating film 18 that is in contact with the lower electrode 14 and a segment of the heat dissipating film 18 that is in contact with the upper electrode 16 are formed separately from each other in order to avoid short circuiting between the lower electrode 14 and the upper electrode 16.

Figure 3:
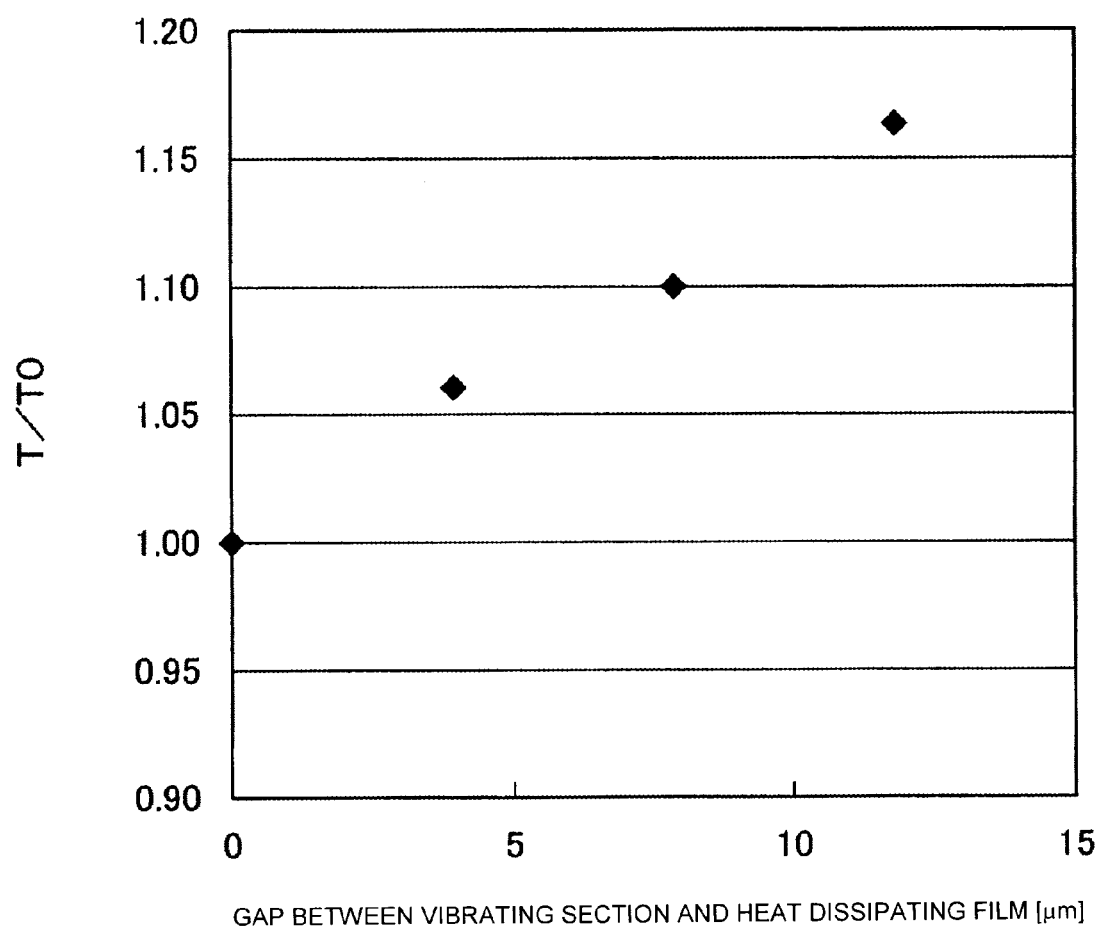
FIG. 3 is a graph showing a relationship between a gap between a vibrating section and a heat dissipating film and heat dissipation in the piezoelectric resonator.

From the perspective of heat dissipation, the gap between the vibrating section 11b and the heat dissipating film 18 is preferably as small as possible, as shown in FIG. 3. At the same time, in order to avoid negative effect on vibration of the vibrating section 11b, the gap between the vibrating section 11b and the heat dissipating film 18 is preferably on the order of about one half of the vibration wavelength ($\lambda$) of the vibrating section 11b. The gap refers to the distance between the inner circumference of the window 18a of the heat dissipating film 18 and the outer edge of the vibrating section 11b in a surface direction of the films 14, 15, and 16 constituting the vibrating section 11b.

In FIG. 3, a temperature in a case where the gap is 0 μm is denoted as T0, and a temperature in a case where a gap is provided is denoted as T. FIG. 3 shows that heat dissipation is improved as T/T0 becomes smaller. FIGS. 3 to 6 deal with an example where the heat dissipating film 18 is composed of silicon.

Figure 4:
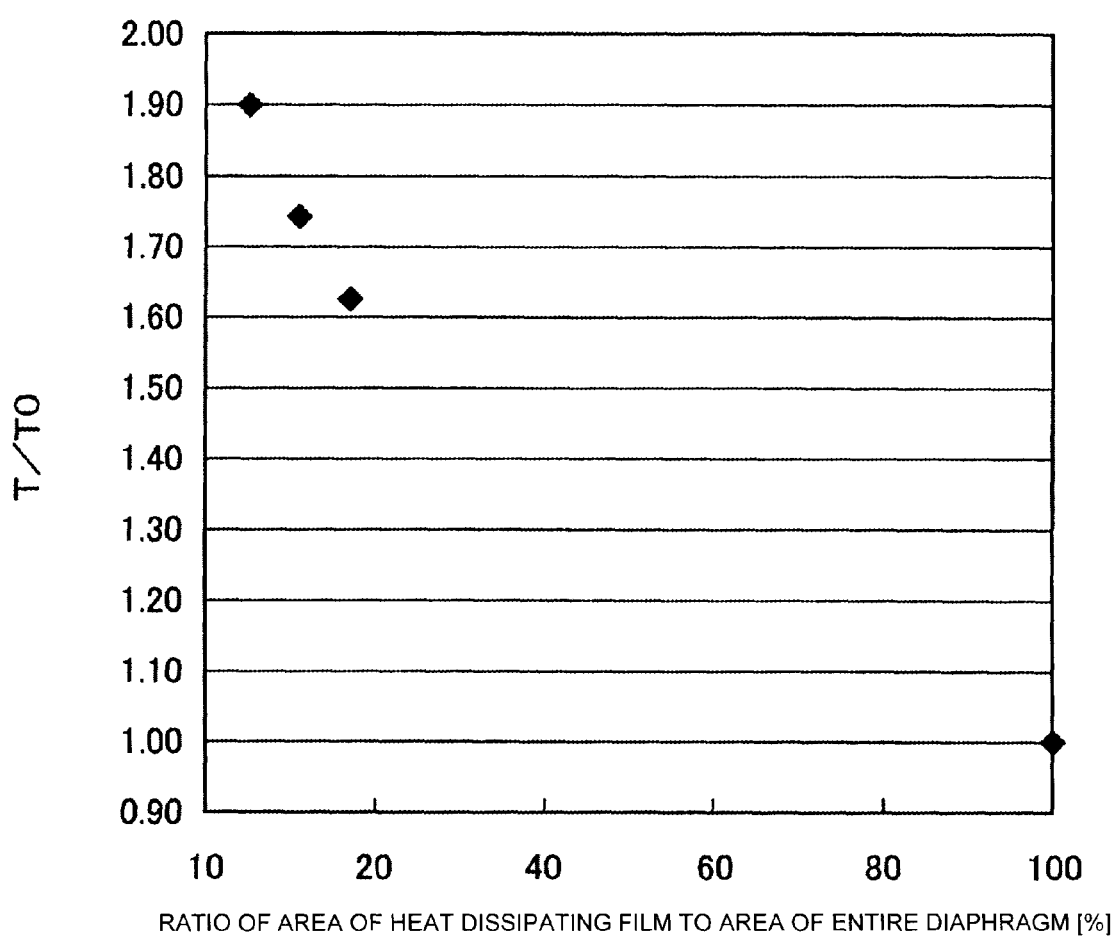
FIG. 4 is a graph showing a relationship between the width of the heat dissipating film and heat dissipation in the piezoelectric resonator.

Furthermore, the pattern width of the heat dissipating film 18 is preferably chosen to be large enough so that the heat dissipating film 18 covers the entire diaphragm 11a as much as possible, as shown in FIG. 4. FIG. 4 shows a ratio T/T0, where T0 denotes a temperature in a case where the heat dissipating film 18 just covers the entire diaphragm 11a. T denotes a temperature in a case where the pattern width of the heat dissipating film 18 is smaller than in the case where the heat dissipating film 18 just covers the entire diaphragm 11a. FIG. 4 shows that heat dissipation is improved as T/T0 becomes smaller.

Figure 5:
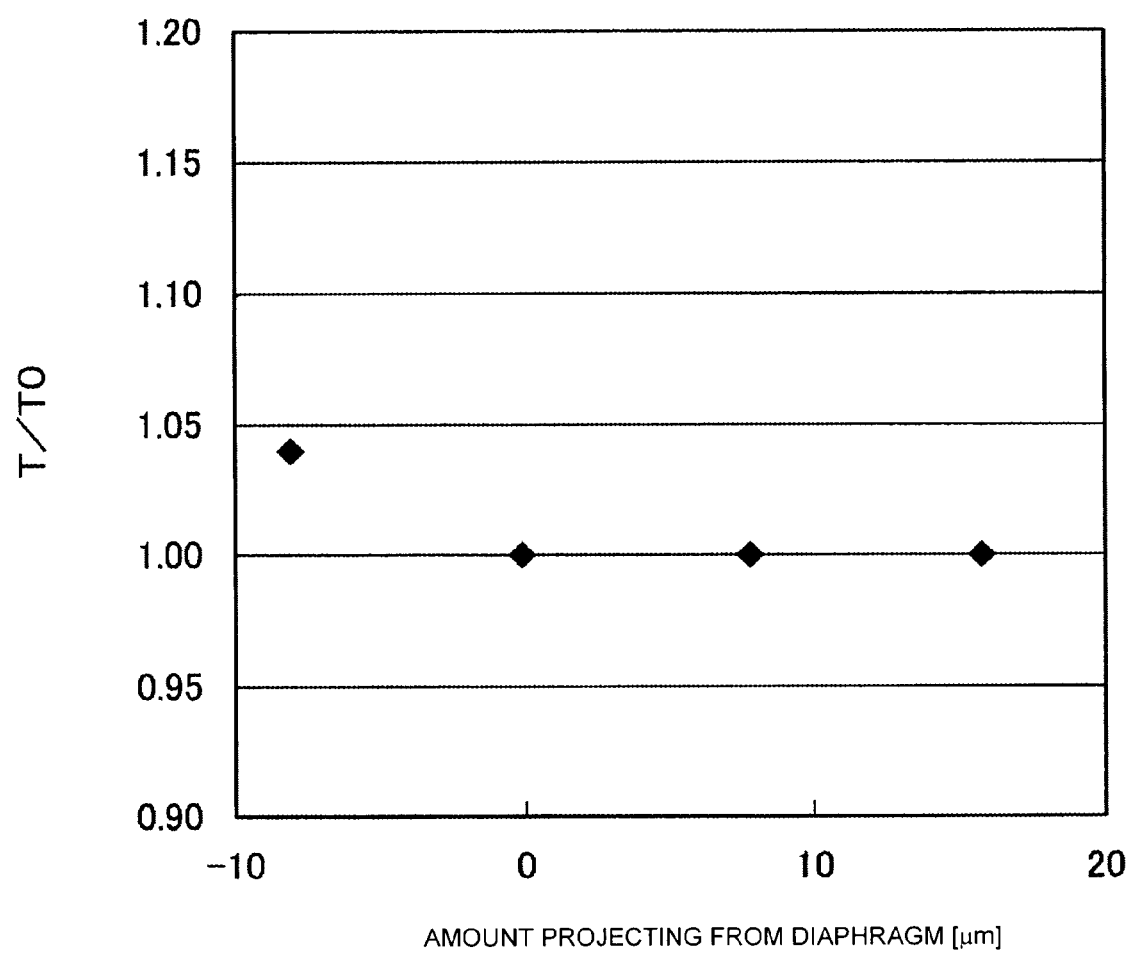
FIG. 5 is a graph showing a relationship between the amount projecting from a diaphragm and heat dissipation in the piezoelectric resonator.

Furthermore, since heat dissipation by the heat dissipating film 18 is degraded if the heat dissipating film 18 does not project from the diaphragm 11a outward in a surface direction thereof, as shown in FIG. 5, the heat dissipating film 18 is preferably formed so as to project from the diaphragm 11a outward in the surface direction thereof considering manufacturing variations of the heat dissipating film 18. In FIG. 5, the vertical (Y) axis represents a ratio of heat-generation temperature with respect to a temperature in a case where the heat dissipating film 18 projects from the diaphragm 11a by approximately 0 μm.

Figure 6:
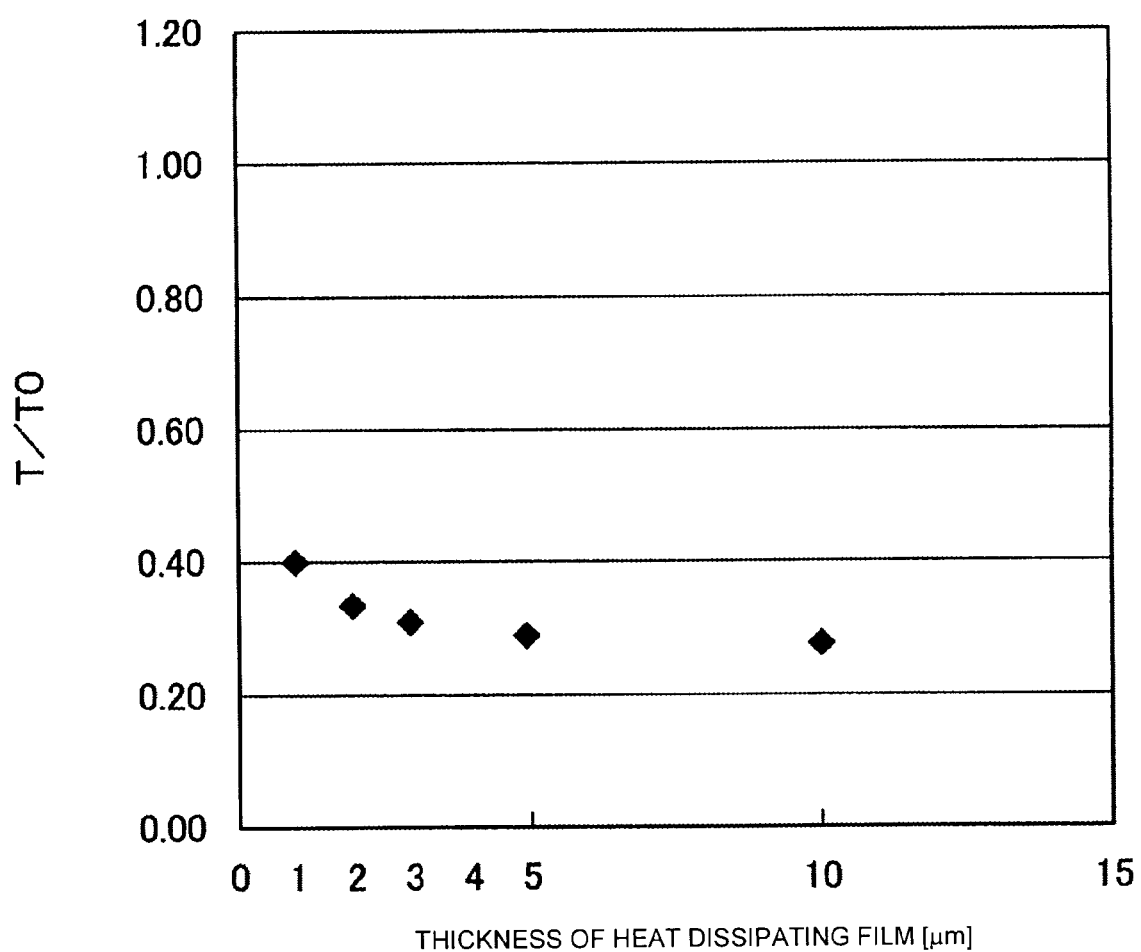
FIG. 6 is a graph showing a relationship between the thickness of the heat dissipating film and heat dissipation in the piezoelectric resonator.

The thickness of the heat dissipating film 18 is preferably as thick as possible from the perspective of heat dissipation. However, the effect of heat dissipation substantially saturates at about 5 μm and heat dissipation is not significantly improved even if the heat dissipating film 18 is made even thicker, as shown in FIG. 6. Thus, if the heat dissipating film 18 is preferably made of silicon, a thickness of about 1 μm or larger is preferable, and a thickness in a range of about 2 μm to about 5 μm is more preferable. In FIG. 6, the vertical (Y) axis represents a ratio of heat-generation temperature with respect to a temperature (T0) in a case where the thickness is approximately 0 μm.

Figure 7A:
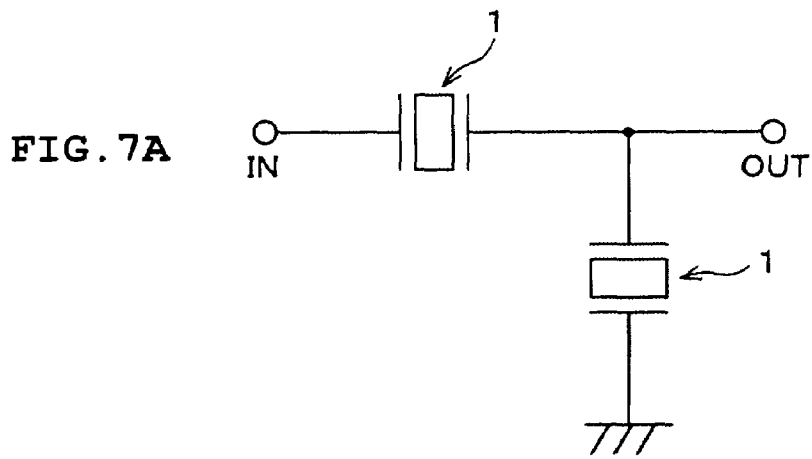
FIG. 7 is a block circuit diagram showing examples of a piezoelectric filter including the piezoelectric filter, FIG. 7A showing an L-shaped ladder filter, FIG. 7B showing a π-shaped ladder filter, and FIG. 7C showing a T-shaped ladder filter.
Figure 7B:
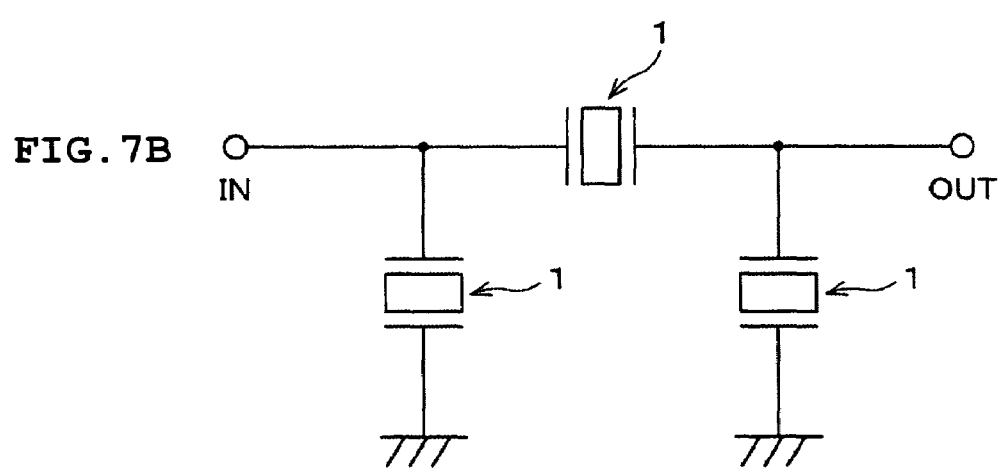
Figure 7C:
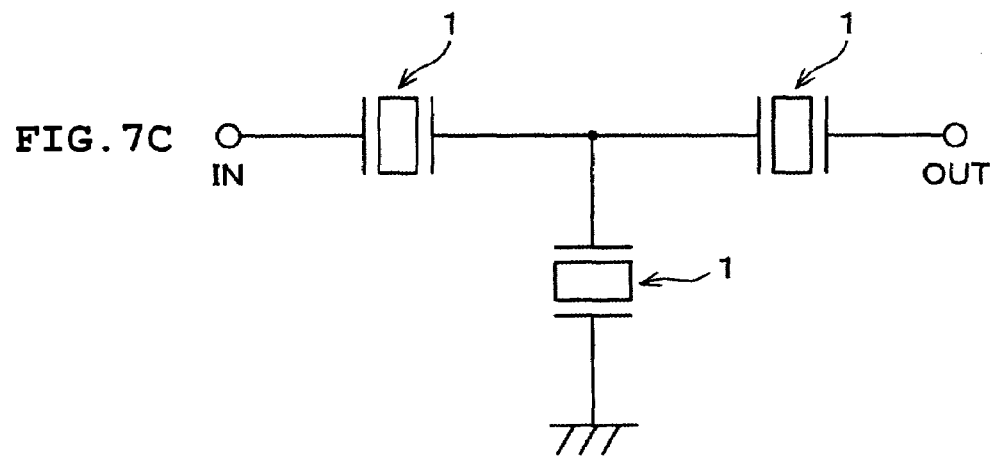

As shown in FIGS. 7A to 7C, the piezoelectric resonator 1 according to various preferred embodiments of the present invention can be used in an L-shaped, π-shaped, or T-shaped ladder piezoelectric filter according to the present invention, and can also be used suitably in modifications where two or more stages of piezoelectric filter are included.

In the piezoelectric ladder filter described above, a passband formed between an antiresonant frequency and a resonant frequency of the piezoelectric resonator 1, which constitute attenuation poles, respectively, is highly selective. Thus, the piezoelectric ladder filter has stopbands having sharp attenuation characteristics, including the attenuation poles, on both sides of the passband. Furthermore, the piezoelectric ladder filter is resistant to heat generation in continuous operation, achieving an improved stability over time.

Figure 8:
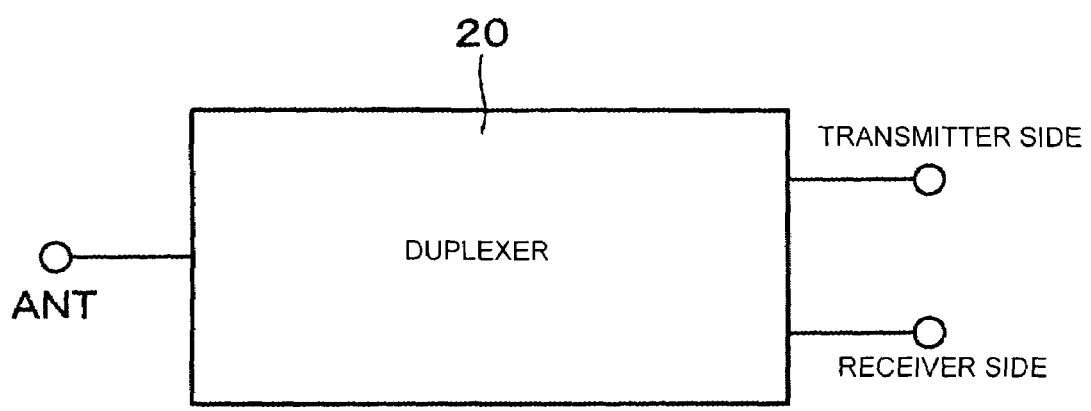
FIG. 8 is a block diagram of a duplexer including the piezoelectric filter.
Figure 9:
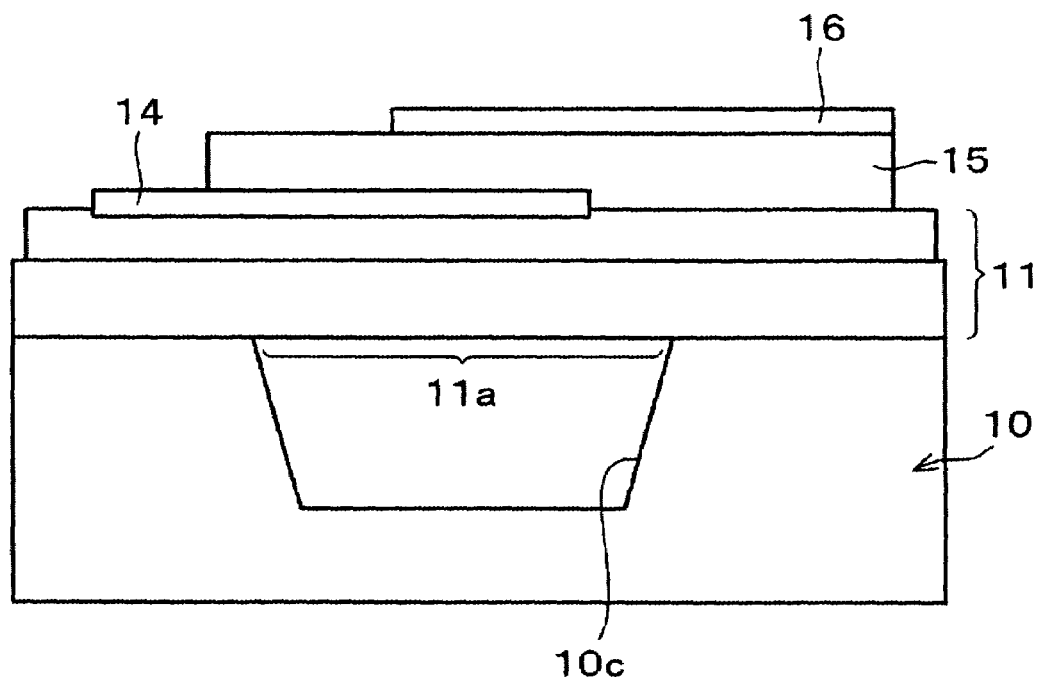
FIG. 9 is a sectional view showing a modification of the piezoelectric resonator.

The piezoelectric filter according to various preferred embodiments of the present invention, described above, can be used in a duplexer 20, as shown in FIG. 8. The duplexer 20 includes a piezoelectric filter on the transmitter side and a piezoelectric filter on the receiver side. The filters are implemented suitably by piezoelectric filters according to the above-described preferred embodiments of the present invention, the filters having passbands close to each other, having sharp attenuation characteristics, and having favorable thermal stability.

Although the opening penetrating through the supporting substrate 10 in the thickness direction thereof is provided in the first preferred embodiment described above, without limitation thereto, a concavity 10c not penetrating through the supporting substrate 10 in the thickness direction thereof may be provided on the supporting substrate 10, forming the diaphragm 11a on the concavity 10c.

Second Preferred Embodiment

Next, a second preferred embodiment of the present invention will be described with reference to FIGS. 7A to 12. In preferred embodiments described below, elements that are functionally equivalent to those in the first preferred embodiment described above are designated by the same reference numerals, and descriptions thereof will be omitted.

Figure 10:
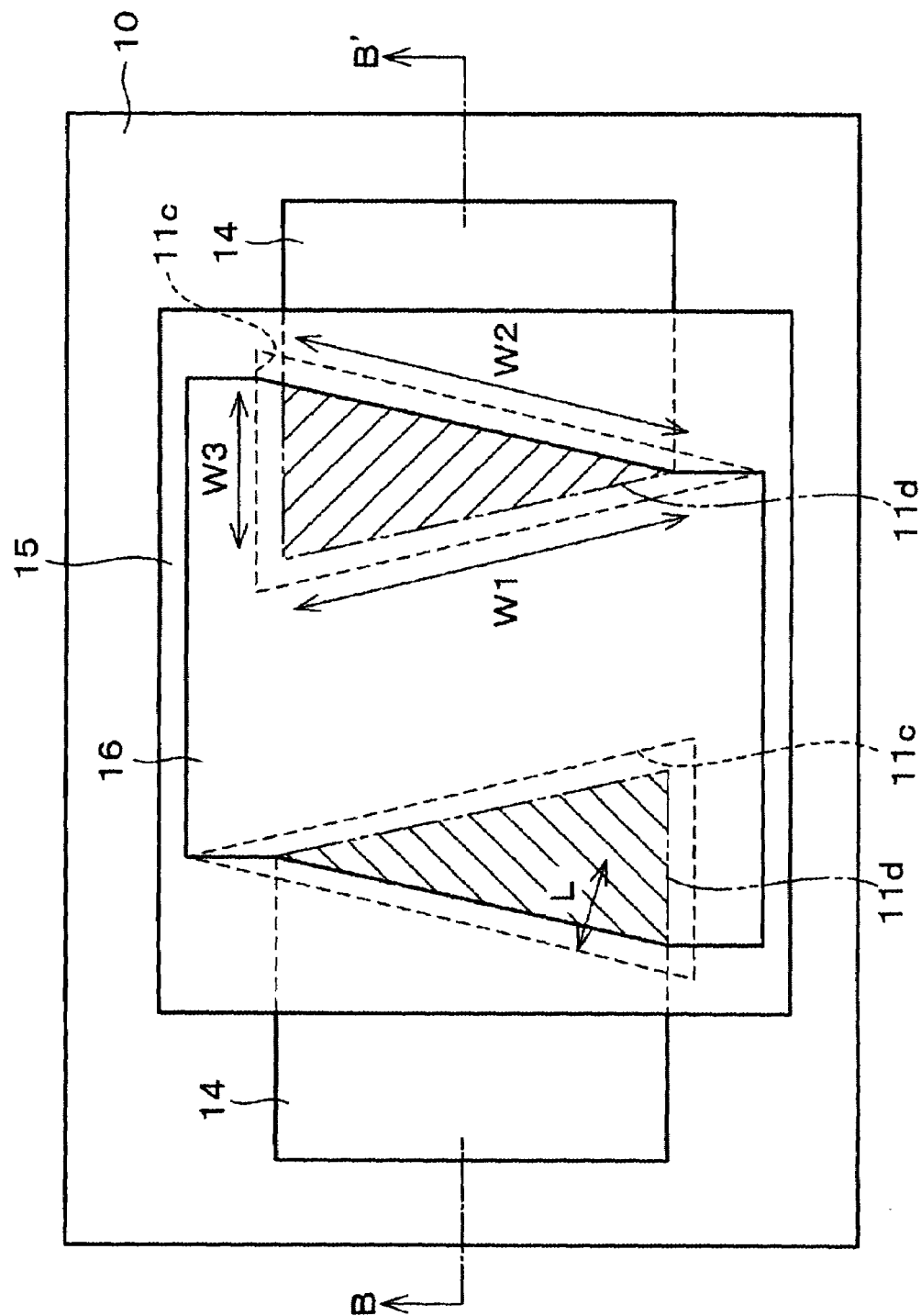
FIG. 10 is a plan view of a piezoelectric resonator and piezoelectric filter according to a second preferred embodiment of the present invention.
Figure 11:
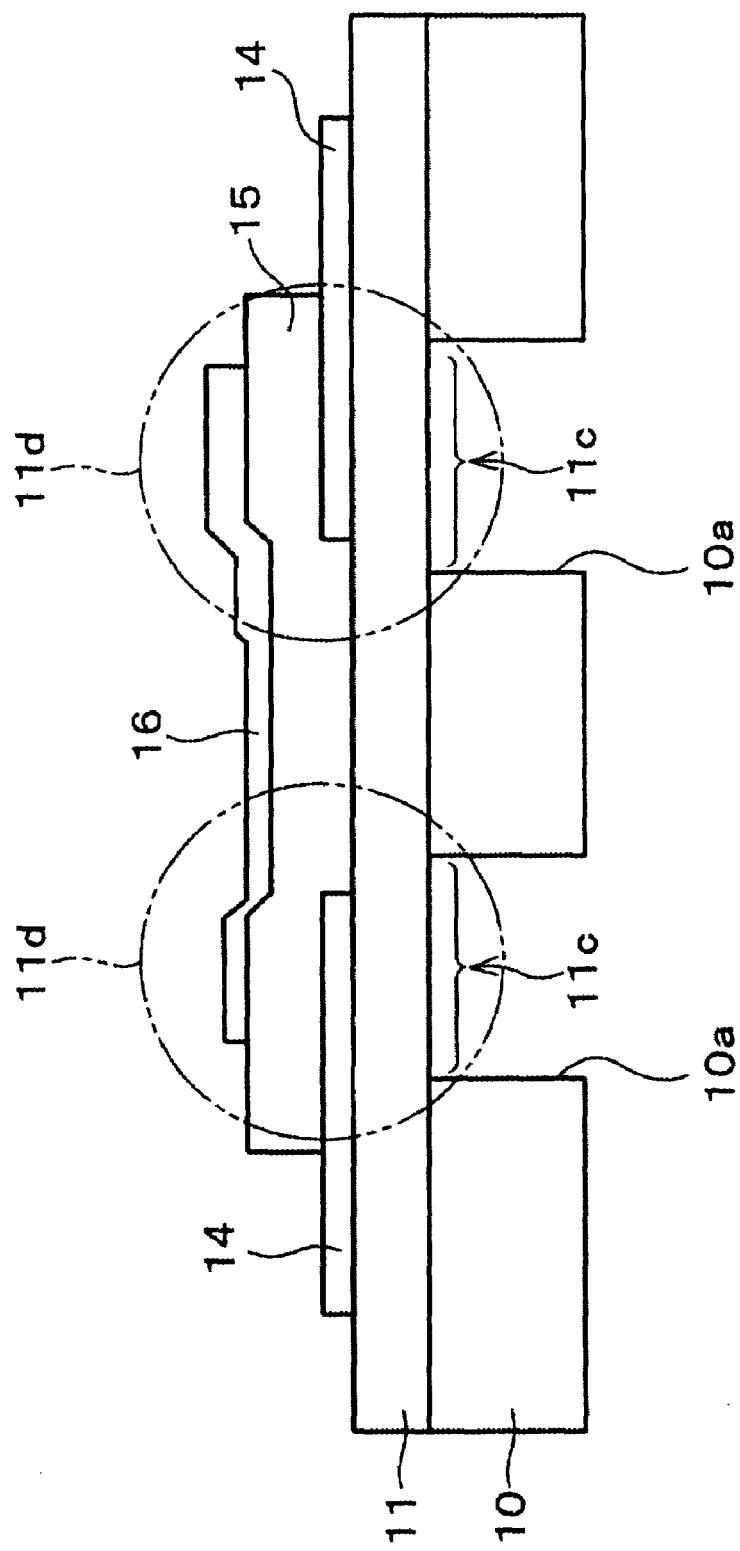
FIG. 11 is a sectional view of the piezoelectric resonator and piezoelectric filter, taken along a line B–B' in FIG. 10.
Figure 12:
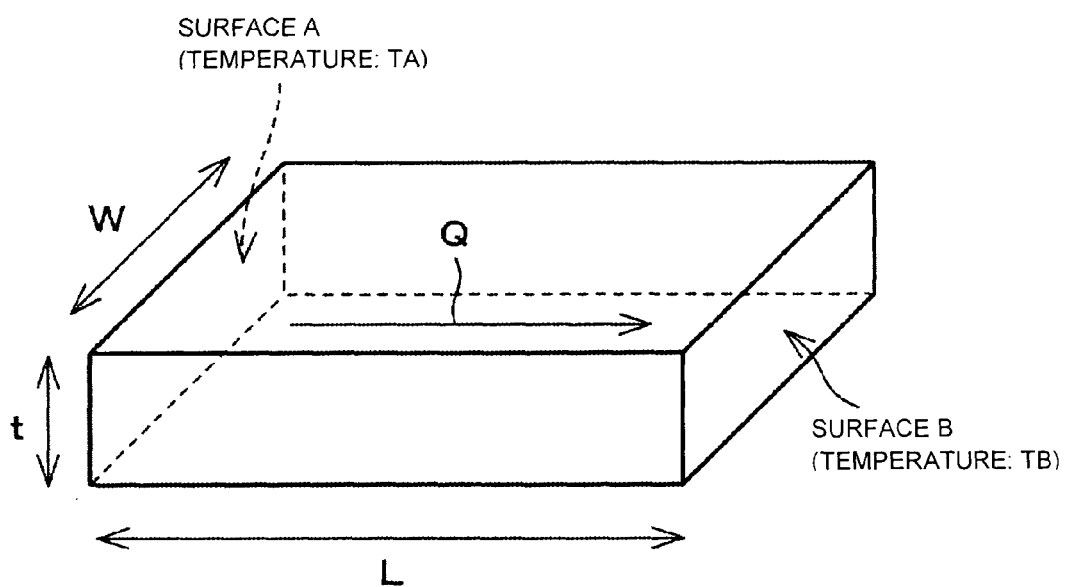
FIG. 12 is a perspective view of a substantially rectangular parallelepiped solid for explaining heat transfer in the piezoelectric resonator and piezoelectric filter.

A piezoelectric resonator according to the second preferred embodiment differs from that of the first preferred embodiment in that, as shown in FIGS. 10 and 11, the heat dissipating film 18 is omitted (may be used in combination as will be described later) and in that the shapes of a diaphragm 11c and a vibrating section 11d as viewed in a thickness direction are strip shaped, for example, isoscelestriangle shaped (or polygonal shaped), a longer edge of the vibrating section 11d along a lengthwise direction thereof extending along an edge of the diaphragm 11c.

Regarding the shape of the vibrating section 11d, the lengths of longer edges W1 and W2 are preferably about twenty times the vibration wavelength (λ) of the vibrating section 11d or longer, and the length of a shorter edge W3 is preferably not longer than about five times the vibrating wavelength (λ). In this arrangement, the thermal resistance between the vibrating section 11d and the supporting substrate 10 is reduced, that is, heat dissipation is improved, as will be described later.

In this case, in order the vibration of the vibrating section 11d being affected, the diaphragm 11c is formed with an edge opposing the vibrating section 11d disposed at a distance (e.g., a distance on the order of about one half the vibration wavelength (λ) of the vibrating section 11d is preferable) from the vibrating section 11d. The vibrating section 11d can be formed in the shape described above by forming the lower electrode 14 in a trapezoidal shape, forming the upper electrode 16 in a substantially parallelogram shape, and adjusting the opposing positions of the lower electrode 14 and the upper electrode 16.

Thus, in the arrangement described above, the diaphragm 11c is arranged along the vibrating section 11d, so that the edges of the vibrating section 11d adjacent to the edges of the diaphragm 11c (W1+W2+W3) become longer, to thereby improve heat dissipation. Furthermore, since the vibrating section 11d is strip shaped, the length L of the heat transfer path becomes shorter, facilitating heat dissipation. Furthermore, since the vibrating section 11d is strip shaped, spurious vibration of the piezoelectric resonator is prevented, thereby significantly improving resonance characteristics and heat dissipation.

In another piezoelectric filter according to another preferred embodiment of the present invention, two piezoelectric resonators of the type described above are arranged in an L-shaped ladder structure, as shown in FIG. 7A. In this case, the vibrating sections 11d of the respective piezoelectric resonators are preferably disposed substantially parallel to each other with respect to lengthwise directions thereof from the perspective of miniaturization. Furthermore, the vibrating sections 11d of the respective piezoelectric resonators are preferably symmetrical to each other with respect to a point at the center of an imaginary line connecting the centers thereof from the perspective of miniaturization.

Next, principles of thermal conduction will be described. The amount of heat transferred from a surface A to a surface B of a solid shown in FIG. 12 can be expressed by the following equation:

$$Q = \lambda \cdot W \cdot t \cdot (TA - TB)/L \quad (1)$$

where λ denotes thermal conductivity, W denotes the width of a cross section of a heat transfer path, t denotes the thickness of the cross section of the heat transfer path, TA denotes a temperature (K) of the surface A, TB denotes a temperature (K) of the surface B, and L denotes the length of the heat transfer path.

The thermal resistance R, which represents resistance to heat transfer, can be expressed by the following equation:

$$R = L/(\lambda \cdot W \cdot t) \quad (2)$$

From equation (2), it is understood that the amount of heat dissipation Q becomes larger (the thermal resistance becomes smaller) as λ·W·t becomes larger and L becomes smaller. In the second preferred embodiment, λ represents the thermal conductivity of the diaphragm 11c, W represents (W1+W2+W3) in FIG. 12, t represents the thickness of the diaphragm 11c, and L represents L in FIG. 12 (the distance between the center of the vibrating section 11d as viewed in the thickness direction and the edge of the diaphragm 11c).

Furthermore, equation (1) can be rearranged as λ=Q·L/{W·t·(TA−TB)}, so that the unit of λ is λ=W·m/(m²·K)=W/(m·K).

In the second preferred embodiment, the distance between the longest edge of the vibrating section 11d and the diaphragm 11c is preferably zero at a minimum, and ideally about one half of λ, with which vibration of the vibrating section 11d is not interfered with. However, the upper limit is a target value in design, and a process margin must be added to the upper limit since variation actually exists in the manufacturing process.

The reasons for setting the distance as described above are as follows. From the perspective of heat dissipation, the distance between the longest edge of the vibrating section 11d and the edge of the diaphragm 11c is preferably as short as possible (ideally zero). However, if the distance is zero, vibration of the vibrating section 11d is affected, causing degradation in resonance characteristics. From the perspective of resonance characteristics, the longest edge of the vibrating section 11d should be somewhat separated from the edge of the diaphragm 11c. That is, the resonance characteristics and heat dissipation have a tradeoff relationship. The resonance characteristics become unaffected at a distance of about one half of λ.

The distance between the longest edge of the vibrating section 11d and the edge of the diaphragm 11c is ideally about one half of λ considering both heat dissipation and resonance characteristics. However, an actual manufacturing margin is not so precise, so that considerable variation exists in the distance relative to the ideal value. Thus, the distance is "approximately" one half of lambda. The process margin is up to about 35 µm in the case of wet etching process and up to about 20 µm in the case of dry etching process.

For example, let the following conditions be assumed: 1.9 GHz band, second harmonic wave, an upper electrode having a thickness of about 0.18 µm and made of Al, a piezoelectric thin film having a thickness of about 1.6 µm and made of ZnO, a lower electrode having a thickness of about 0.18 µm and made of Al, an AlN film having a thickness of about 1.8 µm, and an SiO₂ film having a thickness of about 0.6 µm. Then, if λ=4.3 µm, 35 µm=8.1 λ and 20 µm=4.7 λ. That is, a margin of 35 µm=8.1 λ or 20 µm=4.7 λ is provided relative to the ideal ½λ=2.15 µm. The vibration wavelength λ differs depending on the frequency band, film configuration, material, and the order of vibrating wave (fundamental wave, second harmonic wave, etc.). The process margin is constant regardless of frequency. (The margin, however, varies with processing method.) The deviation becomes larger as the frequency band goes higher.

The amplitude of leaked vibration becomes small when the distance reaches about ½λ. If a fixed edge (the edge of the diaphragm 11c) is provided at a distance of about ½λ from the vibrating section 11d, the effect on vibration is small and degradation of resonance characteristics is small. On the other hand, if the vibrating section 11d is located too far from the edge (fixed edge) of the diaphragm 11c or from another vibrating section, heat dissipation is degraded, and the dimensions thereof become larger although the effect thereof on vibration characteristics is alleviated or eliminated.

With this arrangement, sufficient heat dissipation is achieved. In addition, a heat dissipating film may be formed on the piezoelectric thin film 15 and the upper electrode 16 except over the vibrating section 11d as in the first preferred embodiment, which further improves heat dissipation.

Third Preferred Embodiment

Figure 13:
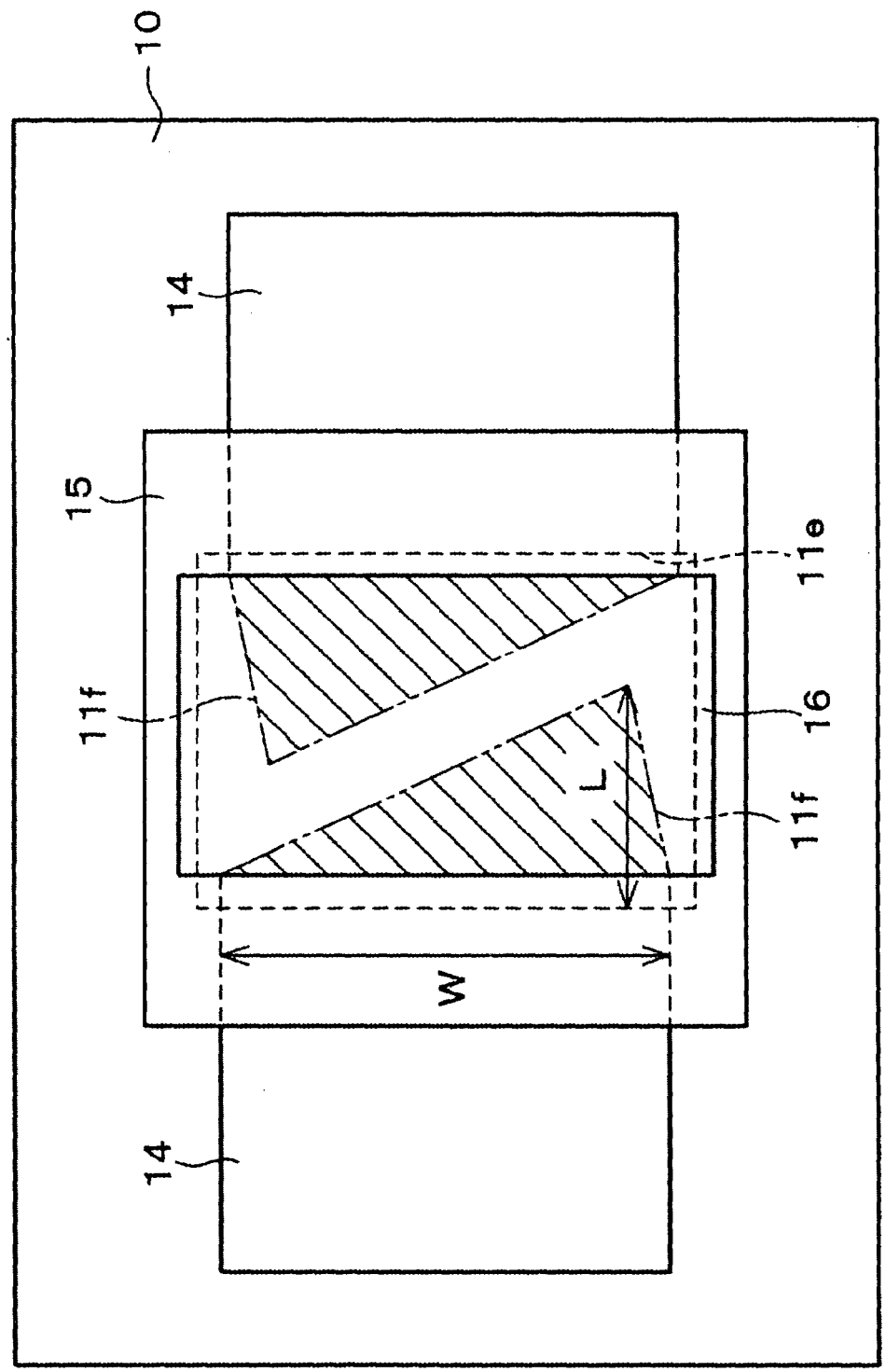
FIG. 13 is a plan view of a piezoelectric resonator and piezoelectric filter according to a third preferred embodiment of the present invention.
Figure 14:
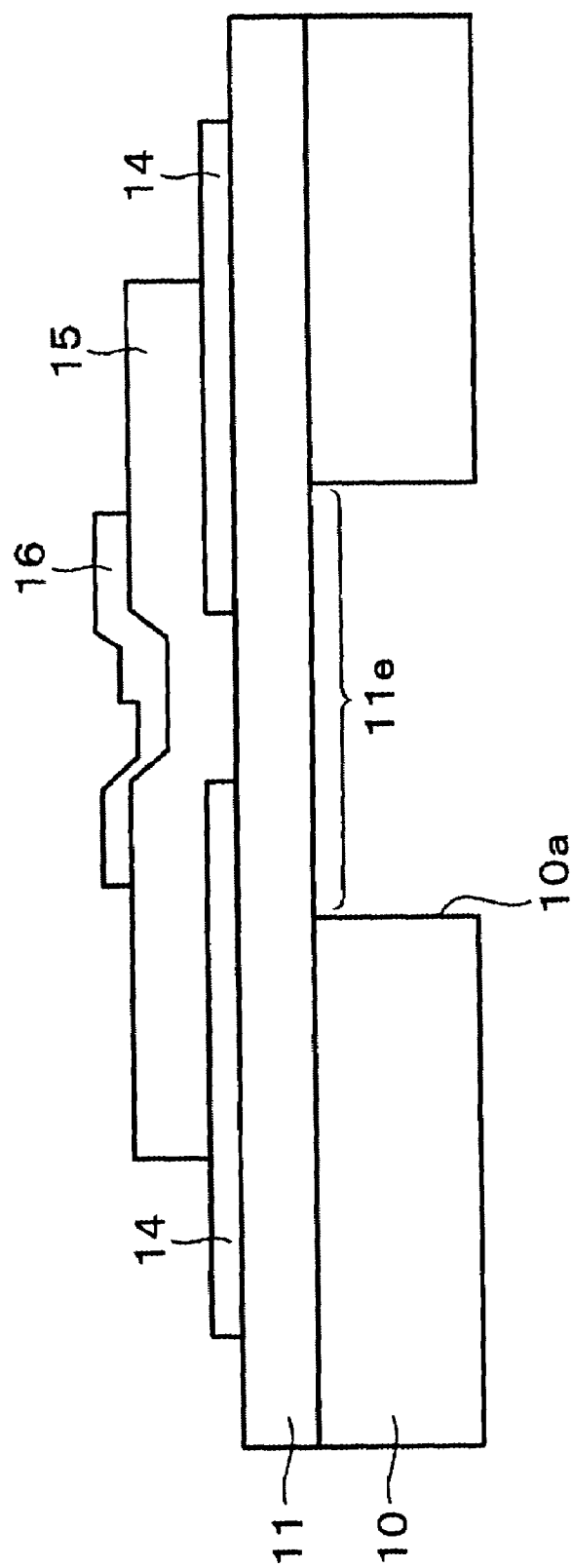
FIG. 14 is a sectional view of the piezoelectric resonator and piezoelectric filter.

In a third preferred embodiment of the present invention, an L-shaped ladder piezoelectric filter is implemented by two piezoelectric resonators disposed on one diaphragm 11e having a substantially rectangular shape as viewed in a thickness direction, as shown in FIGS. 13 and 14. In this case, vibrating sections 11f each have a shape of an isosceles triangle as in the second preferred embodiment, and a longer edge of each of the vibrating sections 11f is disposed along an edge of the diaphragm 11e.

Thus, the piezoelectric resonators and the piezoelectric filter according to the third preferred embodiment exhibit the same advantages as in the second preferred embodiment. Furthermore, the overall area of the device can be reduced, serving to reduce the size of the device, compared with the case where diaphragms are formed respectively for piezoelectric resonators.

Figure 15:
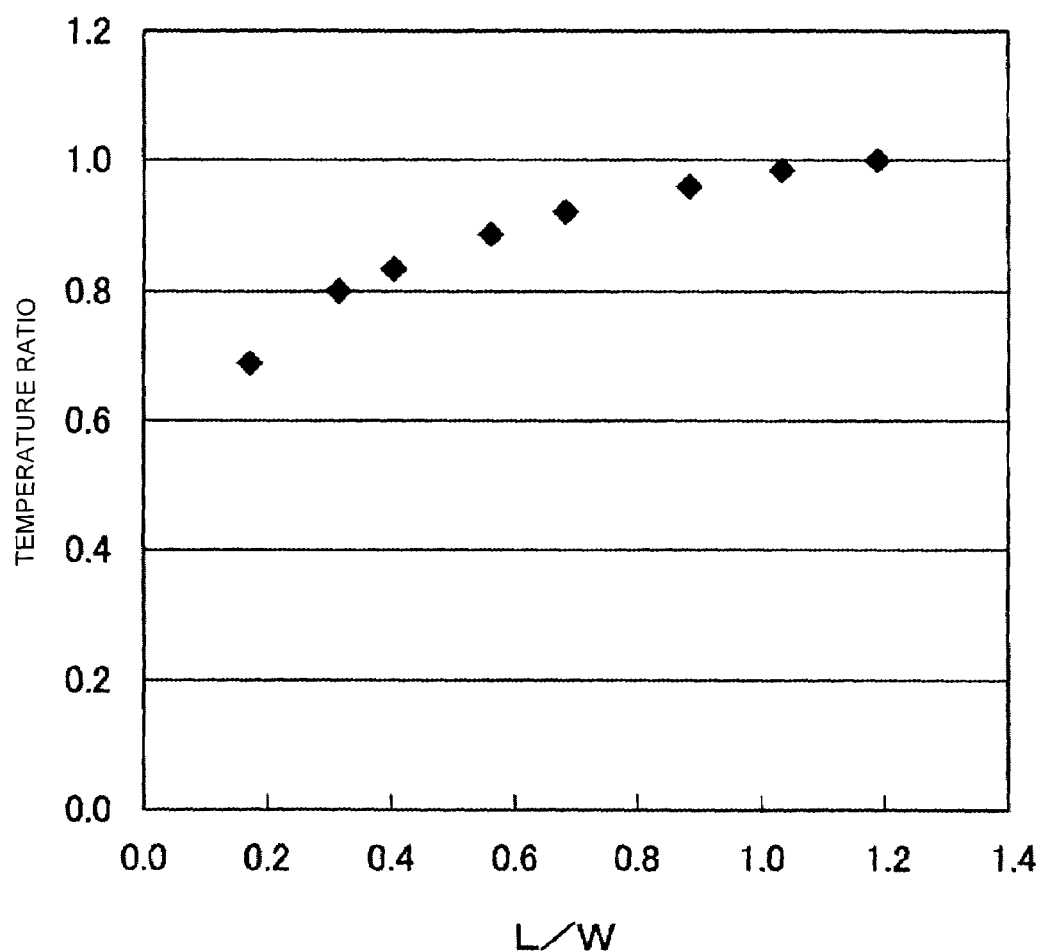
FIG. 15 is a graph showing a relationship between L/W and heat dissipation of the piezoelectric resonator and piezoelectric filter.

FIG. 15 shows a relationship between a ratio of L to W (L/W) shown in FIG. 13 and a ratio of heat-generation temperature. L corresponds to the height of the vibrating sections 11f with the longer edges of the vibrating sections 11f opposing the diaphragm 11e as bases, that is, the distance between the edges of the diaphragm 11e and farthest points therefrom of the vibrating sections 11f. W denotes the length of the longer edges of the vibrating sections 11f opposing the diaphragm 11e. In the graph of temperature ratio and L/W shown in FIG. 15, the temperature ratio is taken with respect to L/W of about 1.19 (a shape approximate to equilateral triangle).

As is apparent from FIG. 15, the temperature becomes lower as L/W becomes smaller, and the heat-generation temperature is significantly lowered at L/W of about 0.8 or smaller.

Fourth Preferred Embodiment

Figure 16:
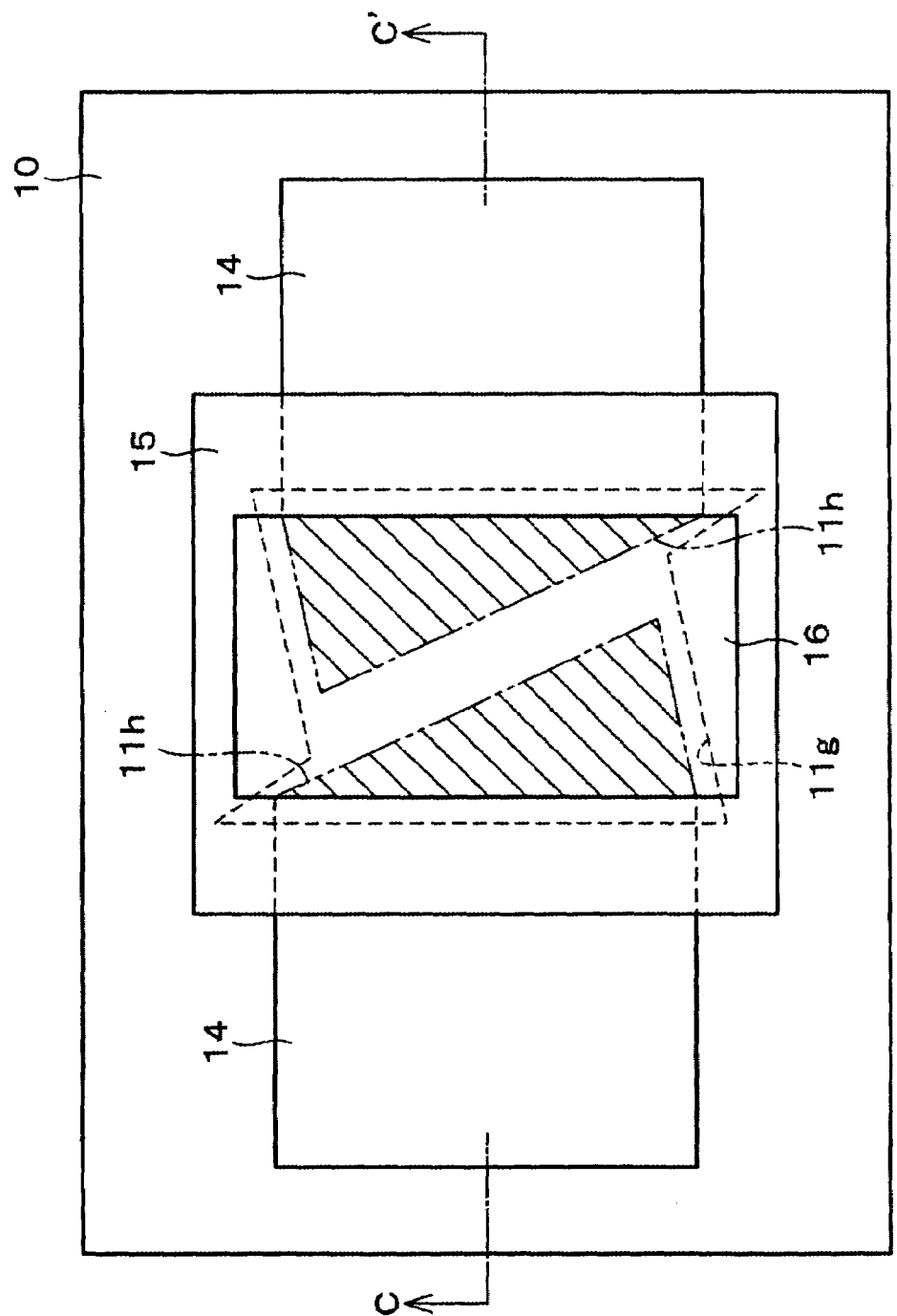
FIG. 16 is a plan view of a piezoelectric resonator and piezoelectric filter according to a fourth preferred embodiment of the present invention.
Figure 17:
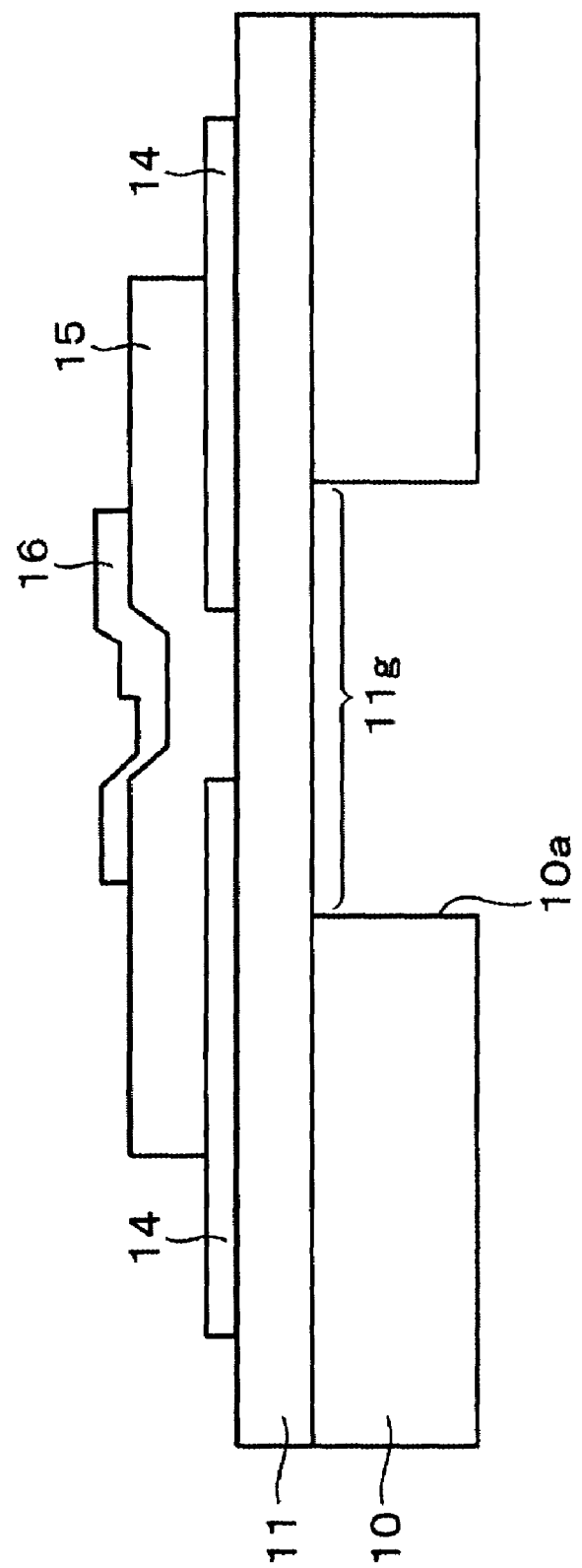
FIG. 17 is a sectional view of the piezoelectric resonator and piezoelectric filter.

In a fourth preferred embodiment of the present invention, one diaphragm 11g is provided similarly to the third preferred embodiment, and vibrating sections 11h corresponding to the two vibrating sections 11f in the third preferred embodiment are provided on the diaphragm 11g, the diaphragm 11g being formed along the outer edges of the vibrating sections 11h, as shown in FIGS. 16 and 17.

Thus, in the fourth preferred embodiment, similarly to the second and third preferred embodiments, miniaturization is allowed while maintaining heat dissipation.

Fifth Preferred Embodiment

Figure 18A:
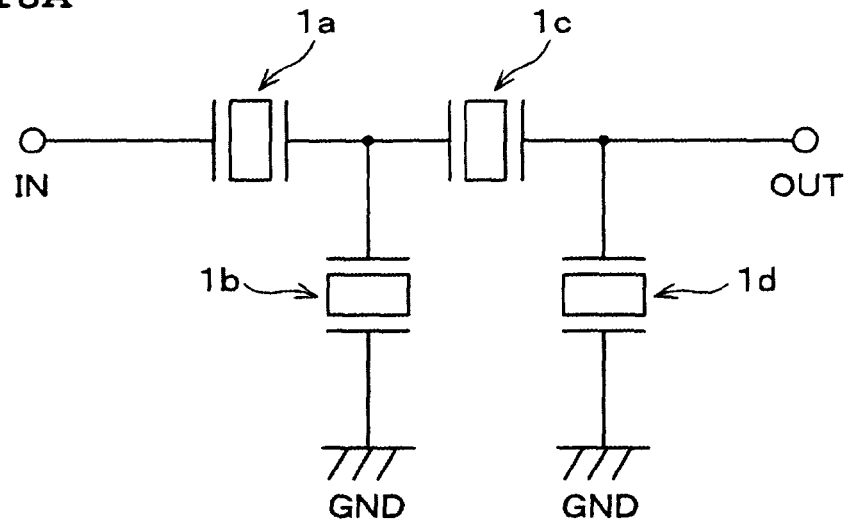
FIGS. 18A to 18C are diagrams showing a piezoelectric filter according to a fifth preferred embodiment of the present invention, FIG. 18A showing a block circuit diagram, FIG. 18B showing a plan view, and FIG. 18C showing a sectional view taken along a line D–D' in FIG. 18B.
Figure 18B:
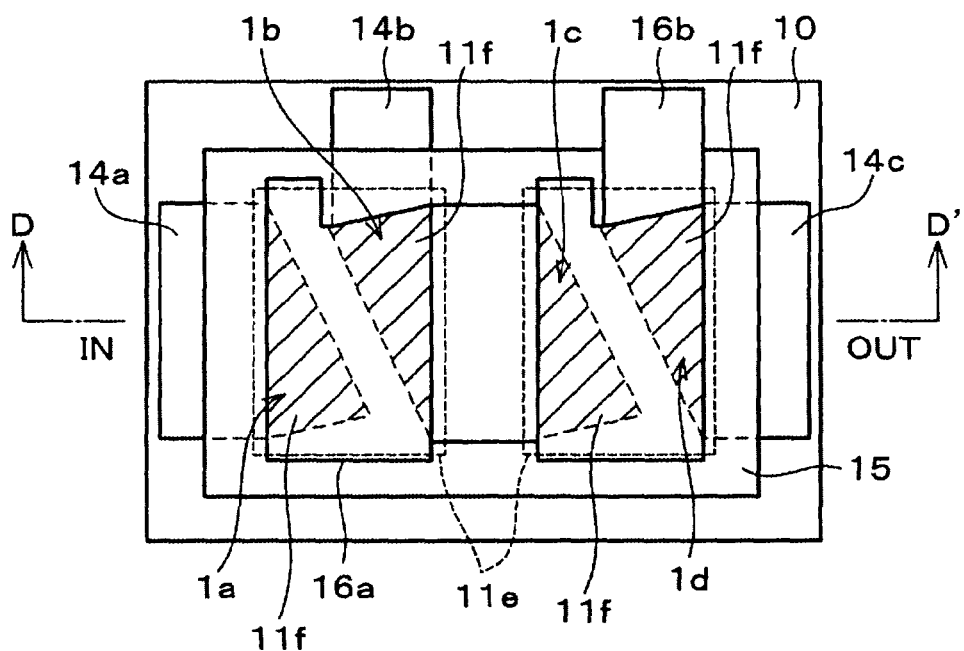
Figure 18C:
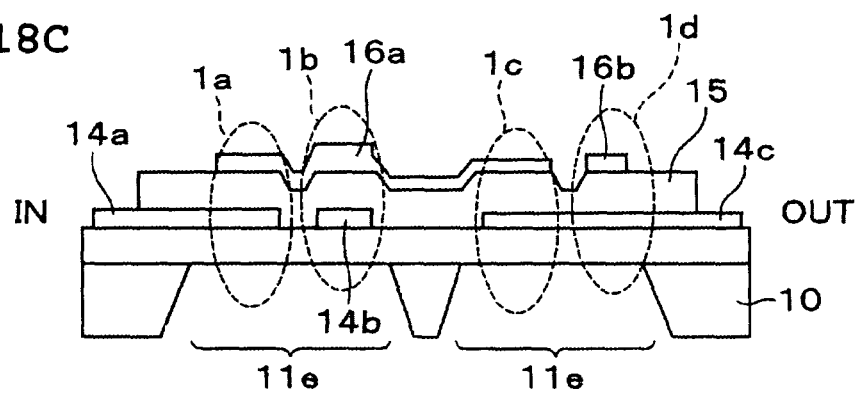

In a fifth preferred embodiment of the present invention, as shown in FIGS. 18A to 18C, diaphragms 11e similar to the one used in the third preferred embodiment are disposed on the supporting substrate 10, and the vibrating sections 11f used in the third preferred embodiment, i.e., two piezoelectric resonators, are disposed respectively on the diaphragms 11e. The diaphragms 11e are arranged along a direction that is substantially perpendicular to a lengthwise direction of the vibrating sections 11f.

Thus, in the fifth preferred embodiment, using four vibrating sections 11f, piezoelectric resonators 1a and 1b and piezoelectric resonators 1c and 1d are connected in series with each other, whereby a piezoelectric filter including two stages of L-shaped ladder piezoelectric filter is provided.

In the fifth preferred embodiment described above, a lower electrode 14a that defines an input terminal is provided in association with the piezoelectric resonator 1a, an upper electrode 16a that defines a common terminal of the piezoelectric resonators 1a, 1b, and 1c is provided, and a lower electrode 14b that defines a GND terminal of the piezoelectric resonator 1b is provided. Furthermore, a lower electrode 14c that defines a common output terminal of the piezoelectric resonators 1c and 1d is formed, and an upper electrode 16b that defines a GND terminal of the piezoelectric resonator 1d is provided.

Thus, in the fifth preferred embodiment, similarly to the second to fourth preferred embodiments described above, miniaturization is allowed while maintaining heat dissipation.

The piezoelectric resonators according to the first to fifth preferred embodiments of the present invention and piezoelectric filters including the same can be suitably used in the duplexer 20 shown in FIG. 8. Although the second to fifth preferred embodiments have been described separately from the first preferred embodiment, the features of the second to the fifth preferred embodiments may be combined with the features of the first preferred embodiment as appropriate.

Figure 19:
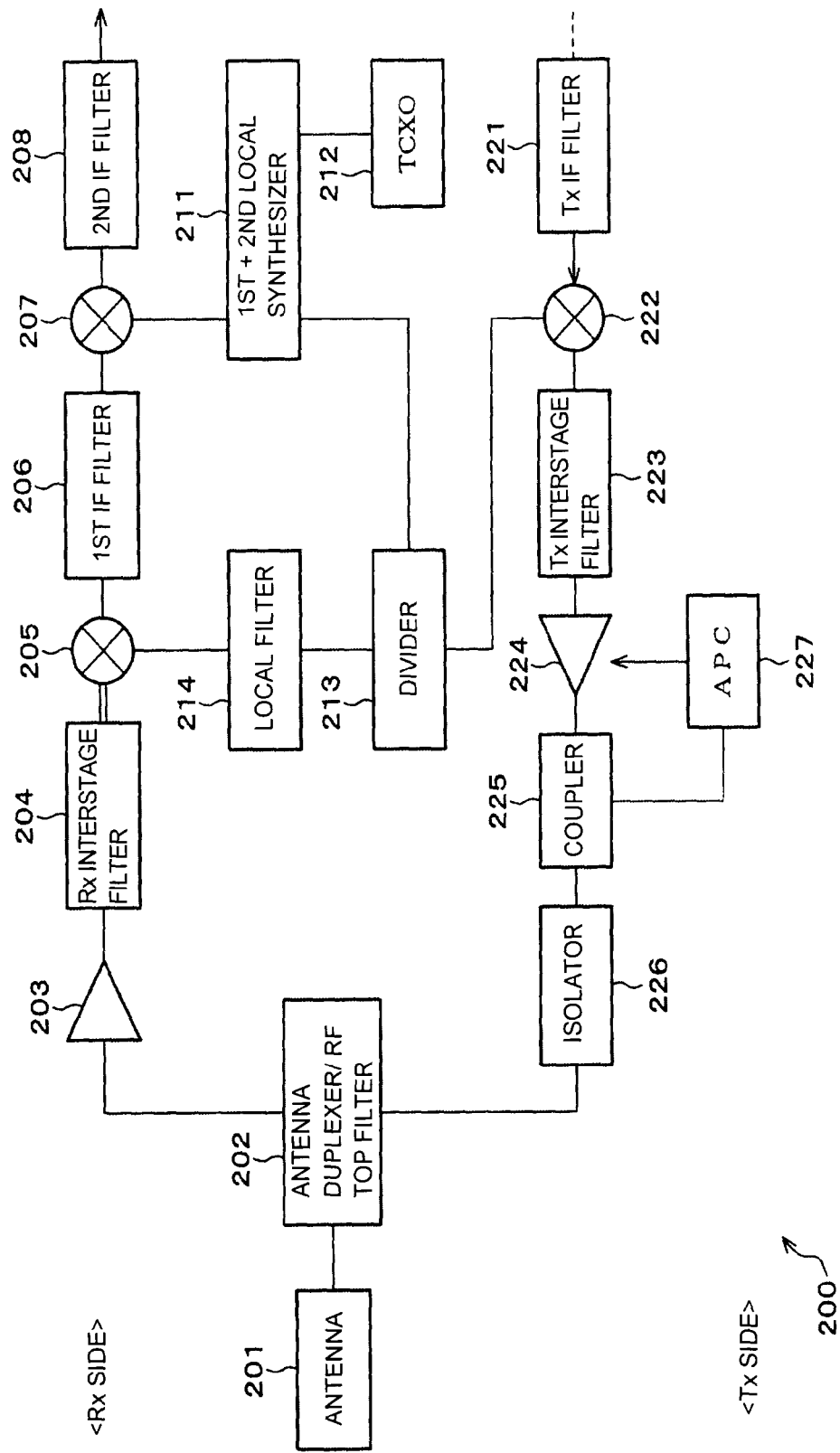
FIG. 19 is a block circuit diagram of a communication device according to a preferred embodiment of the present invention.

Next, a communication device including piezoelectric resonators and piezoelectric filters according to various preferred embodiments of the present invention will be described with reference to FIG. 19. Referring to FIG. 19, a communication device 200 preferably includes, on the receiver side (Rx side), an antenna 201, an antenna duplexer/RF top filter 202, an amplifier 203, an Rx interstage filter 204, a mixer 205, a 1st IF filter 206, a mixer 207, a 2nd IF filter 208, a 1st+2nd local synthesizer 211, a temperature-compensated crystal oscillator (TCXO) 212, a divider 213, and a local filter 214. Between the Rx interstage filter 204 and the mixer 205, balanced signals are preferably used in order to assure balance, as indicated by double lines in FIG. 19.

Furthermore, the communication device 200 includes, on a transmitter side (Tx side), the antenna 201 and the antenna duplexer/RF top filter 202 shared with the receiver side, a Tx IF filter 221, a mixer 222, a Tx interstage filter 223, an amplifier 224, a coupler 225, an isolator 226, and an automatic power controller (APC) 227.

The antenna duplexer/RF top filter 202, the Rx interstage filter 204, the 1st IF filter 206, the Tx IF filter 221, and the Tx interstage filter 223 can be suitably implemented by piezoelectric resonators and piezoelectric filters according to any of the first to fifth preferred embodiments of the present invention.

The present invention is not limited to each of the above-described preferred embodiments, and various modifications are possible within the range described in the claims. An embodiment obtained by appropriately combining technical means disclosed in each of the different preferred embodiments is included in the technical scope of the present invention.

What is claimed is:

1. A piezoelectric resonator comprising:
a substrate having one of an opening and a concavity;
a vibrating section in which at least one pair of an upper electrode and a lower electrode oppose each other so as to sandwich an upper surface and a lower surface of a thin-film section having at least one layer of a piezoelectric thin film, the vibrating section being disposed over the one of the opening and the concavity; and
a heat dissipating film located over at least one of the upper electrode and the thin-film section so as not to cover the vibrating section; wherein
the heat dissipating film has a thermal conductivity of approximately 150 W/(m·K) or higher; and the heat dissipating film includes an insulating material selected from the group consisting of silicon, aluminum nitride, and diamond.

2. A piezoelectric resonator according to claim 1, wherein the piezoelectric thin film is composed mainly of zinc oxide or aluminum nitride.

3. A piezoelectric filter comprising a piezoelectric resonator according to claim 2.

4. A piezoelectric resonator according to claim 1, wherein the heat dissipating film includes a metal selected from the group consisting of copper, aluminum, gold, and silver, or an alloy mainly composed of copper, aluminum, gold, or silver.

5. A piezoelectric filter comprising a plurality of piezoelectric resonators according to claim 1, the piezoelectric resonators being arranged in a ladder configuration.

6. A duplexer comprising a piezoelectric resonator according to claim 1.

7. A communication device comprising a piezoelectric resonator according to claim 1.

8. A piezoelectric resonator according to claim 1, wherein the vibrating section has a polygonal shape with edges of different lengths as viewed in a thickness direction, and at least a longest edge of the vibrating section extends along an edge of the one of the opening and the concavity.

9. A piezoelectric resonator according to claim 8, wherein a sum W of all edges of the vibrating section, extending along edges of the one of the opening and the concavity, and a distance L between the opening or the concavity and a point of the vibrating section that is most distant from an edge of the one of the opening and the concavity satisfies a relationship of $L/W \leq 0.8$.

10. A piezoelectric resonator according to claim 8, wherein the vibrating section as viewed in the thickness direction is at least as long as approximately twenty times a vibrating wavelength of the vibrating section in a lengthwise direction thereof, and is not wider than approximately five times the vibrating wavelength in a width direction thereof.

11. A piezoelectric resonator according to claim 8, wherein the vibrating section as viewed in the thickness direction has a shape of an isosceles triangle.

12. A piezoelectric resonator comprising:
a substrate having one of an opening and a concavity;
a vibrating section in which at least one pair of an upper electrode and a lower electrode oppose each other so as to sandwich an upper surface and a lower surface of a thin-film section having at least one layer of a piezoelectric thin film, the vibrating section being disposed over the one of the opening and the concavity; and
a heat dissipating film located over at least one of the upper electrode and the thin-film section so as not to cover the vibrating section; wherein
a distance between the heat dissipating film and the vibrating section is approximately one half of a vibrating wavelength of the vibrating section; and
the heat dissipating film includes an insulating material selected from the group consisting of silicon, aluminum nitride, and diamond.

13. A piezoelectric resonator according to claim 12, wherein a peripheral region of the one of the opening and the concavity is covered by the heat dissipating film.

14. A piezoelectric resonator according to claim 12, wherein the piezoelectric thin film is composed mainly of zinc oxide or aluminum nitride.

15. A piezoelectric filter comprising a piezoelectric resonator according to claim 12.

16. A piezoelectric filter comprising a plurality of piezoelectric resonators according to claim 12, the piezoelectric resonators being arranged in a ladder configuration.

17. A piezoelectric resonator comprising:
a substrate having one of an opening and a concavity; and
a vibrating section in which at least one pair of an upper electrode and a lower electrode oppose each other so as to sandwich an upper surface and a lower surface of a thin-film section having at least one layer of a piezoelectric thin film, the vibrating section being disposed over the one of the opening and the concavity; wherein
the vibrating section as viewed in a thickness direction has a polygonal shape with edges of different lengths, and at least a longest edge of the vibrating section extends along an edge of the one of the opening and the concavity; and
a distance between the longest edge of the vibrating section and the edge of the one of the opening and the concavity is approximately one half of a vibrating wavelength of the vibrating section.

18. A piezoelectric resonator according to claim 17, wherein all the edges of the vibrating section extend along edges of the one of the opening and the concavity, and distances between all the edges of the vibrating section and the associated edges of the one of the opening and the concavity are approximately one half of the vibrating wavelength of the vibrating section.

19. A piezoelectric resonator according to claim 17, wherein a sum W of all edges of the vibrating section, extending along edges of the one of the opening and the concavity, and a distance L between the one of the opening and the concavity and a point of the vibrating section that is most distant from an edge of the opening or the concavity satisfies a relationship of $L/W \leq 0.8$.

20. A piezoelectric resonator according to claim 17, wherein the vibrating section as viewed in the thickness direction is at least as long as than approximately twenty times a vibrating wavelength of the vibrating section in a lengthwise direction thereof, and is not wider than approximately five times the vibrating wavelength in a width direction thereof.

21. A piezoelectric resonator according to claim 17, wherein the vibrating section as viewed in the thickness direction has a shape of an isosceles triangle.

22. A piezoelectric resonator according to claim 17, wherein the longest edge of the vibrating section has a length that is longer than a distance between the one of the opening and the concavity and a point of the vibrating section that is most distant from the edge of the one of the opening and the concavity.

23. A piezoelectric filter comprising a piezoelectric resonator according to claim 17.

24. A piezoelectric filter comprising a plurality of piezoelectric resonators according to claim 17, the piezoelectric resonators being arranged in a ladder configuration.

25. A duplexer comprising a piezoelectric resonator according to claim 17.

26. A communication device comprising a piezoelectric resonator according to claim 17.

27. A piezoelectric resonator comprising:
a substrate having one of an opening and a concavity;
a vibrating section in which at least one pair of an upper electrode and a lower electrode oppose each other so as to sandwich an upper surface and a lower surface of a thin-film section having at least one layer of a piezoelectric thin film, the vibrating section being disposed over the one of the opening and the concavity; and a heat dissipating film located over at least one of the upper electrode and the thin-film section so as not to cover the vibrating section; wherein
the one of the opening and the concavity is entirely covered by the heat dissipating film except over the vibrating section.

28. A communication device comprising a piezoelectric resonator according to claim 27.

29. A piezoelectric resonator according to claim 27, wherein the piezoelectric thin film is composed mainly of zinc oxide or aluminum nitride.

30. A piezoelectric filter comprising a piezoelectric resonator according to claim 27.

31. A piezoelectric filter comprising a plurality of piezoelectric resonators according to claim 27, the piezoelectric resonators being arranged in a ladder configuration.

32. A duplexer comprising a piezoelectric resonator according to claim 27.

33. A communication device comprising a piezoelectric resonator according to claim 27.

34. A duplexer comprising a piezoelectric resonator according to claim 27.

35. A piezoelectric resonator comprising:
a substrate having one of an opening and a concavity;
a vibrating section in which at least one pair of an upper electrode and a lower electrode oppose each other so as to sandwich an upper surface and a lower surface of a thin-film section having at least one layer of a piezoelectric thin film, the vibrating section being disposed over the one of the opening and the concavity; and
a heat dissipating film located over at least one of the upper electrode and the thin-film section so as not to cover the vibrating section;
wherein the vibrating section has a polygonal shape with edges of different lengths as viewed in a thickness direction, and at least a longest edge of the vibrating section extends along an edge of the one of the opening and the concavity; and
a distance between the longest edge of the vibrating section and the edge of the one of the opening and the concavity is approximately one half of a vibrating wavelength of the vibrating section.

36. A piezoelectric resonator according to claim 35, wherein the longest edge of the vibrating section has a length that is longer than a distance between the one of the opening and the concavity and a point of the vibrating section that is most distant from the edge of the one of the opening and the concavity.

37. A piezoelectric resonator according to claim 35, wherein all the edges of the vibrating section extend along edges of the one of the opening and the concavity, and distances between all the edges of the vibrating section and the associated edges of the one of the opening and the concavity are approximately one half of the vibrating wavelength of the vibrating section.

38. A piezoelectric resonator according to claim 35, wherein a sum W of all edges of the vibrating section, extending along edges of the one of the opening and the concavity, and a distance L between the opening or the concavity and a point of the vibrating section that is most distant from an edge of the one of the opening and the concavity satisfies a relationship of $L/W \leq 0.8$.

39. A piezoelectric resonator according to claim 35, wherein the vibrating section as viewed in the thickness direction is at least as long as approximately twenty times a vibrating wavelength of the vibrating section in a lengthwise direction thereof, and is not wider than approximately five times the vibrating wavelength in a width direction thereof.

40. A piezoelectric resonator according to claim 35, wherein the vibrating section as viewed in the thickness direction has a shape of an isosceles triangle.

41. A piezoelectric resonator according to claim 35, wherein the piezoelectric thin film is composed mainly of zinc oxide or aluminum nitride.

42. A piezoelectric filter comprising a piezoelectric resonator according to claim 35.

43. A piezoelectric filter comprising a plurality of piezoelectric resonators according to claim 35, the piezoelectric resonators being arranged in a ladder configuration.

44. A duplexer comprising a piezoelectric resonator according to claim 35.

45. A communication device comprising a piezoelectric resonator according to claim 35.

* * * * *